United States Patent
Ueda et al.

(10) Patent No.: US 9,786,493 B2
(45) Date of Patent: Oct. 10, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Tatsushi Ueda, Toyama (JP); Junichi Tanabe, Toyama (JP); Katsuhiko Yamamoto, Toyama (JP); Yuki Taira, Toyama (JP); Naofumi Ohashi, Toyama (JP); Hideharu Itatani, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 69 days.

(21) Appl. No.: 14/778,170

(22) PCT Filed: Mar. 19, 2014

(86) PCT No.: PCT/JP2014/057540
§ 371 (c)(1),
(2) Date: Sep. 18, 2015

(87) PCT Pub. No.: WO2014/148551
PCT Pub. Date: Sep. 25, 2014

(65) Prior Publication Data
US 2016/0284532 A1    Sep. 29, 2016

(30) Foreign Application Priority Data
Mar. 22, 2013    (JP) ................................. 2013-060963

(51) Int. Cl.
*H01L 21/02*    (2006.01)
*C23C 16/455*    (2006.01)
(Continued)

(52) U.S. Cl.
CPC ........ *H01L 21/0228* (2013.01); *C23C 16/401* (2013.01); *C23C 16/4412* (2013.01);
(Continued)

(58) Field of Classification Search
None
See application file for complete search history.

(56) References Cited

U.S. PATENT DOCUMENTS

2006/0035035 A1    2/2006  Sakama
2008/0242116 A1    10/2008 Clark
(Continued)

FOREIGN PATENT DOCUMENTS

JP    02-151021 A    6/1990
JP    10-312970 A    11/1998
(Continued)

*Primary Examiner* — Jack Chen
(74) *Attorney, Agent, or Firm* — Volpe and Koenig, P.C.

(57) ABSTRACT

A semiconductor device manufacturing method, including: mounting substrates on a mounting table within a processing chamber along a rotation direction of the table; starting to supply a first-element-containing gas to a first region in the chamber along the rotation direction, while rotating the table and exhausting the processing chamber; starting to supply a second-element-containing gas to a second region in the chamber; starting to generate, by a plasma generating unit in the second region, plasma of the second-element-containing gas in the second region to have a first activity; and forming a thin film containing first and second elements on the substrates by rotating the table to cause the substrates to sequentially pass through the first and second regions in turn so that a first-element-containing layer is formed in the first region and is modified in the second region by generating plasma having a second activity higher than the first activity.

6 Claims, 16 Drawing Sheets

(51) Int. Cl.
    *C23C 16/458* (2006.01)
    *C23C 16/52* (2006.01)
    *C23C 16/40* (2006.01)
    *C23C 16/44* (2006.01)
    *C23C 16/509* (2006.01)
    *H01L 21/687* (2006.01)
    *H01J 37/32* (2006.01)
    *C23C 16/56* (2006.01)
    *G03F 7/20* (2006.01)
    *G03F 7/32* (2006.01)

(52) U.S. Cl.
    CPC .... *C23C 16/4584* (2013.01); *C23C 16/45538* (2013.01); *C23C 16/45542* (2013.01); *C23C 16/45551* (2013.01); *C23C 16/45557* (2013.01); *C23C 16/45559* (2013.01); *C23C 16/509* (2013.01); *C23C 16/52* (2013.01); *H01J 37/32091* (2013.01); *H01J 37/32449* (2013.01); *H01J 37/32541* (2013.01); *H01J 37/32568* (2013.01); *H01J 37/32752* (2013.01); *H01J 37/32779* (2013.01); *H01J 37/32834* (2013.01); *H01L 21/02164* (2013.01); *H01L 21/02219* (2013.01); *H01L 21/02274* (2013.01); *H01L 21/68764* (2013.01); *H01L 21/68771* (2013.01); *H01L 21/68785* (2013.01); *C23C 16/56* (2013.01); *G03F 7/20* (2013.01); *G03F 7/32* (2013.01); *H01J 37/32899* (2013.01); *H01J 2237/327* (2013.01); *H01J 2237/334* (2013.01); *H01J 2237/3321* (2013.01); *H01J 2237/3323* (2013.01)

(56) References Cited

U.S. PATENT DOCUMENTS

| | | |
|---|---|---|
| 2012/0052693 A1 | 3/2012 | Ozaki et al. |
| 2016/0276183 A1* | 9/2016 | Ohashi ............ H01L 21/68764 |
| 2016/0284532 A1* | 9/2016 | Ueda ................ H01L 21/02164 |

FOREIGN PATENT DOCUMENTS

| | | |
|---|---|---|
| JP | 2005-268709 A | 9/2005 |
| JP | 2010-530127 A | 9/2010 |
| JP | 2012-049394 A | 3/2012 |

\* cited by examiner

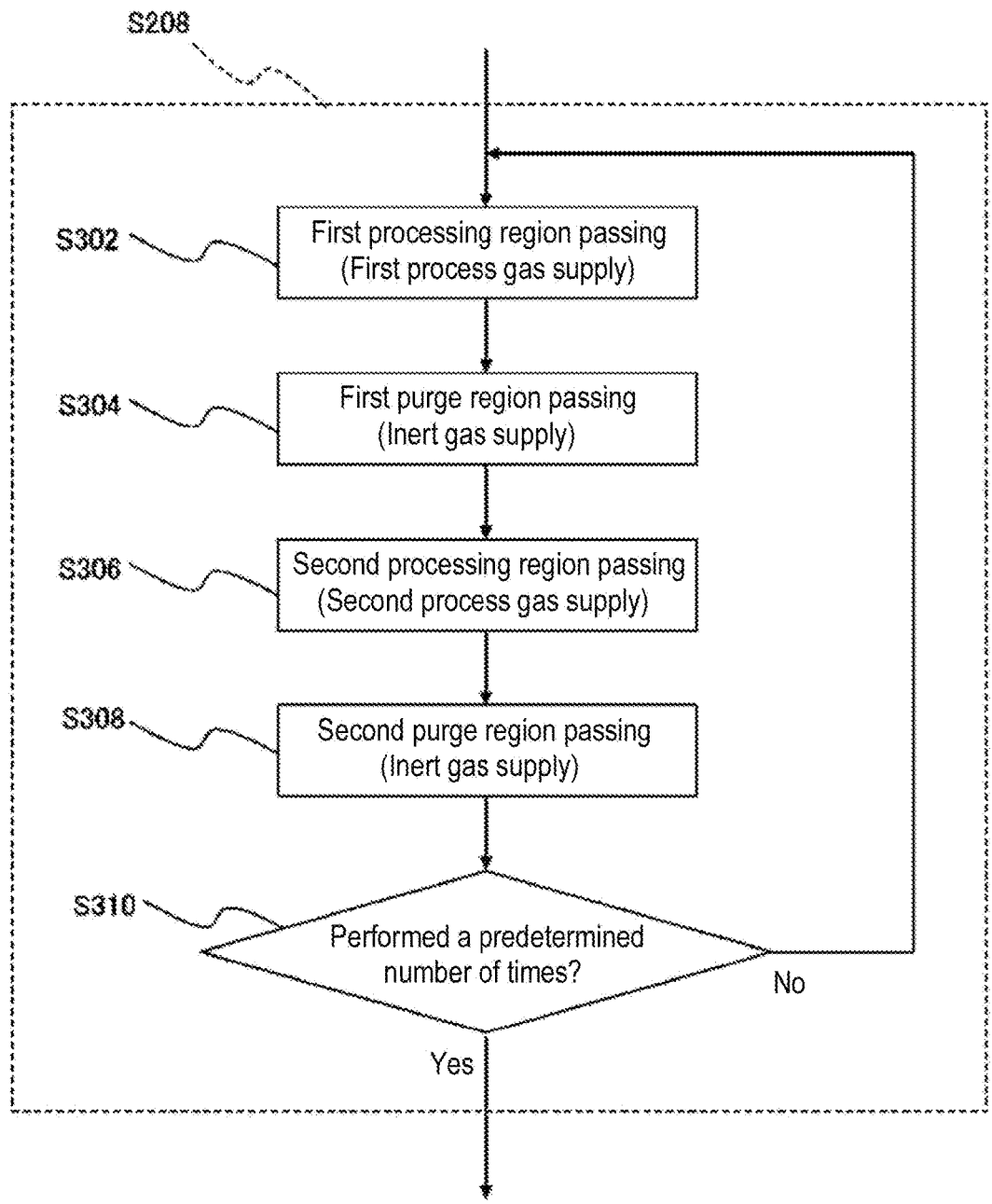

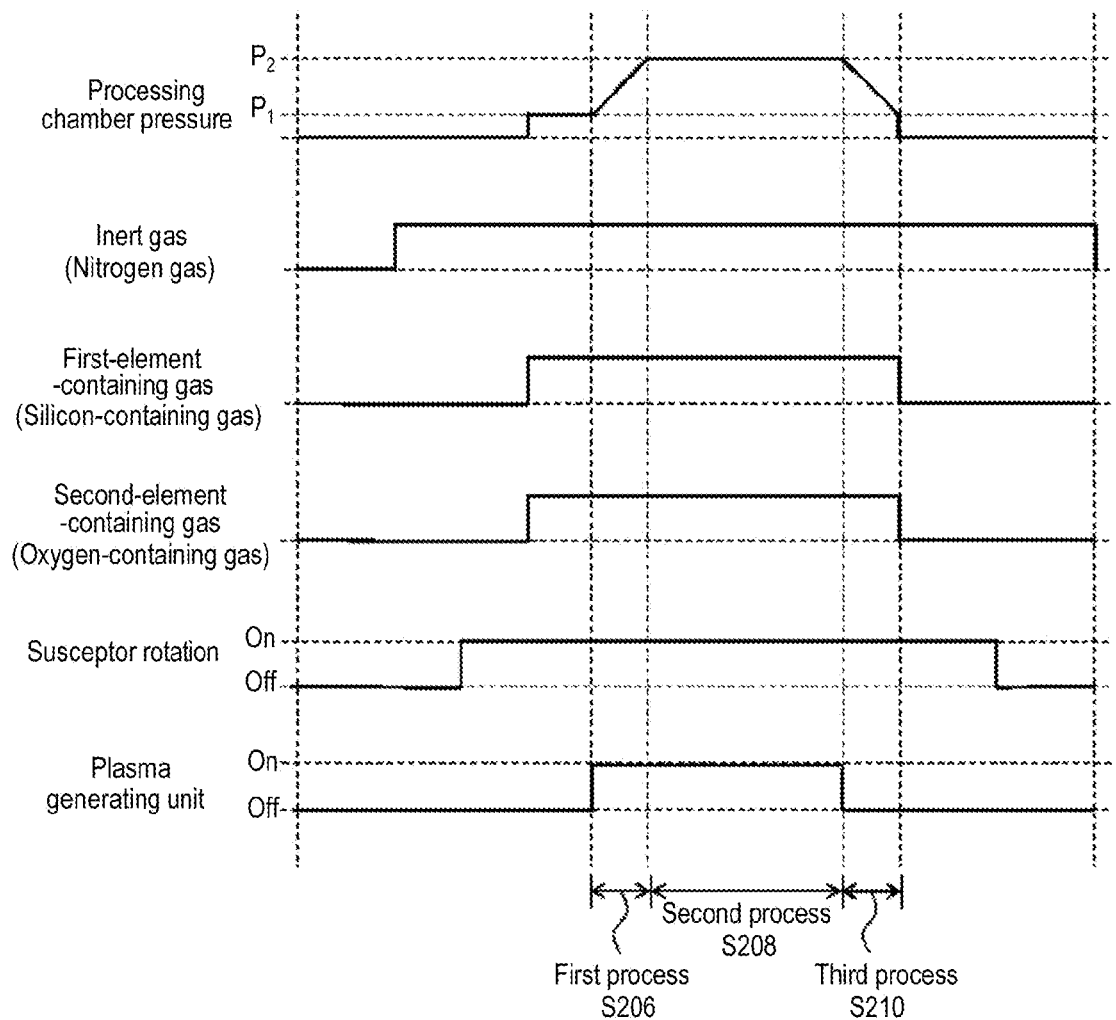

FIG. 9A
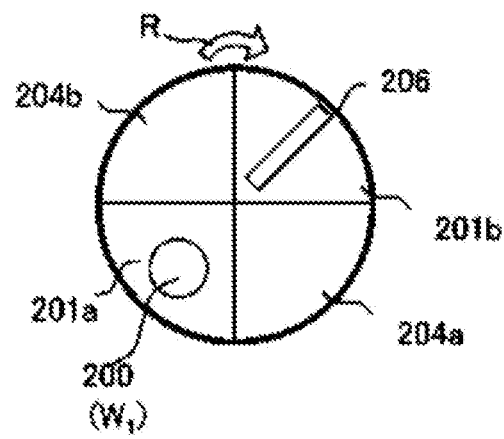
FIG. 9B
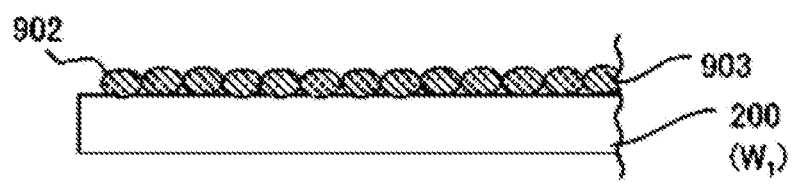
FIG. 9C
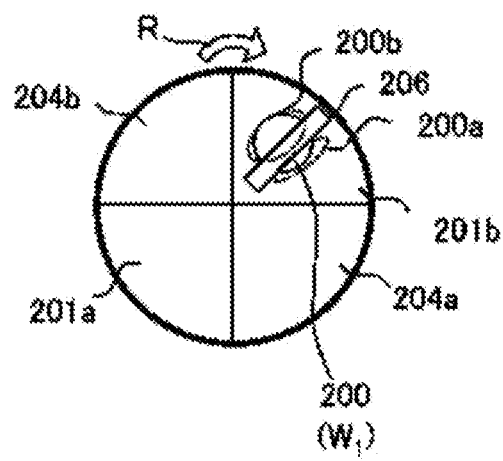

METHOD OF MANUFACTURING SEMICONDUCTOR DEVICE, SUBSTRATE PROCESSING APPARATUS, AND RECORDING MEDIUM

TECHNICAL FIELD

The present disclosure relates to a method of manufacturing a semiconductor device, a substrate processing apparatus and a recording medium.

BACKGROUND

A method of manufacturing semiconductor devices such as, for example, a flash memory or a DRAM (Dynamic Random Access Memory) may include a substrate processing process for forming a thin film on a substrate. As a substrate processing apparatus for performing such a process, there has been known a substrate processing apparatus in which a susceptor having a substrate mounted thereon is moved and passed through a region where plasma of a processing gas is generated by a plasma generating unit so that a thin film is formed on the substrate.

According to a recent miniaturization trend of wiring line dimensions, it becomes important to form a thin film on a single substrate or on plural substrates to have a uniform film thickness within a plane of the single substrate or among the plural substrates, with good reproducibility.

However, in the aforementioned substrate processing apparatus, depending on a state in which the plasma of a processing gas is generated by the plasma generating unit, it is often difficult to form a thin film on a single substrate or on plural substrates, which has a uniform thickness within a plane of the single substrate or among the plural substrates, with good reproducibility. In this case, it may cause a reduction in yield.

The present disclosure provides some embodiments of a method of manufacturing a semiconductor device, a substrate processing apparatus and a recording medium, which are capable of forming a thin film on a single substrate or on plural substrates, which has a uniform thickness within a plane of the single substrate or among the plural substrates.

SUMMARY

According to one embodiment of the present disclosure, there is provided a method of manufacturing a semiconductor device, including: mounting a plurality of substrates on a substrate mounting table rotatably installed within a processing chamber to process the substrates, the substrates being mounted along a rotation direction of the substrate mounting table; starting to supply a first-element-containing gas to a first processing region defined within the processing chamber along the rotation direction of the substrate mounting table, while rotating the substrate mounting table and exhausting an interior of the processing chamber; starting to supply a second-element-containing gas to a second processing region defined within the processing chamber; performing a first processing to begin generating, by a plasma generating unit installed in the second processing region, plasma of the second-element-containing gas in the second processing region to have a first activity; and performing a second processing to form a thin film containing a first element and a second element on each of the substrates by rotating the substrate mounting table to cause the substrates to sequentially pass through the first processing region and the second processing region a predetermined number of times in turn so that a first-element-containing layer is formed in the first processing region, and the first-element-containing layer is modified in the second processing region by generating plasma having a second activity that is higher than the first activity.

According to another embodiment of the present disclosure, there is provided a substrate processing apparatus, including: a processing chamber including a first processing region and a second processing region, wherein substrates are processed in the first processing region and the second processing region; a substrate mounting table rotatably installed within the processing chamber, the substrates being mounted on the substrate mounting table along a rotation direction of the substrate mounting table; a rotating mechanism configured to rotate the substrate mounting table to allow the substrates to sequentially pass through the first processing region and the second processing region in turn; a processing gas supply system configured to supply a first-element-containing gas into the first processing region and to supply a second-element-containing gas into the second processing region; an exhaust system configured to exhaust an interior of the processing chamber and to regulate an internal pressure of the processing chamber; a plasma generating unit installed within the second processing region and configured to generate plasma of the second-element-containing gas in the second processing region; and a control unit configured to control the rotating mechanism, the processing gas supply system, the exhaust system and the plasma generating unit to perform: mounting the substrates on the substrate mounting table along the rotation direction of the substrate mounting table; starting to supply the first-element-containing gas to the first processing region and supply the second-element-containing gas to the second processing region, while rotating the substrate mounting table and exhausting the interior of the processing chamber; performing a first processing to begin generating plasma of the second-element-containing gas to have a first activity in the second processing region by the plasma generating unit; and performing a second processing to form a thin film containing the first element and the second element on each of the substrates by rotating the substrate mounting table to cause the substrates to sequentially pass through the first processing region and the second processing region a predetermined number of times in turn so that a first-element-containing layer is formed on each of the substrates, and the first-element-containing layer is modified with the plasma of the second-element-containing gas by generating plasma to have a second activity lower than the first activity.

According to the present disclosure, it is possible to provide a method of manufacturing a semiconductor device, a substrate processing apparatus and a recording medium, which are capable of making uniform the thickness of a thin film within a plane of a single substrate or the thickness of thin films between plural substrates.

BRIEF DESCRIPTION OF THE DRAWINGS

FIG. 7 is a flowchart of a second process according to the first embodiment of the present disclosure.

FIG. 8 is a view illustrating operation timings of the respective parts in a substrate processing sequence according to the first embodiment of the present disclosure.

FIGS. 9A, 9C and 9E are schematic plan views illustrating wafer positions at a thin film forming step according to the first embodiment of the present disclosure. FIGS. 9B, 9D and 9F are schematic sectional views illustrating formation states of a thin film on a wafer in the case of FIGS. 9A, 9C and 9E.

DETAILED DESCRIPTION

First Embodiment of the Present Disclosure

A first embodiment of the present disclosure will now be described in detail with reference to the accompanying drawings.

(1) Configuration of Substrate Processing Apparatus

Figure 1:
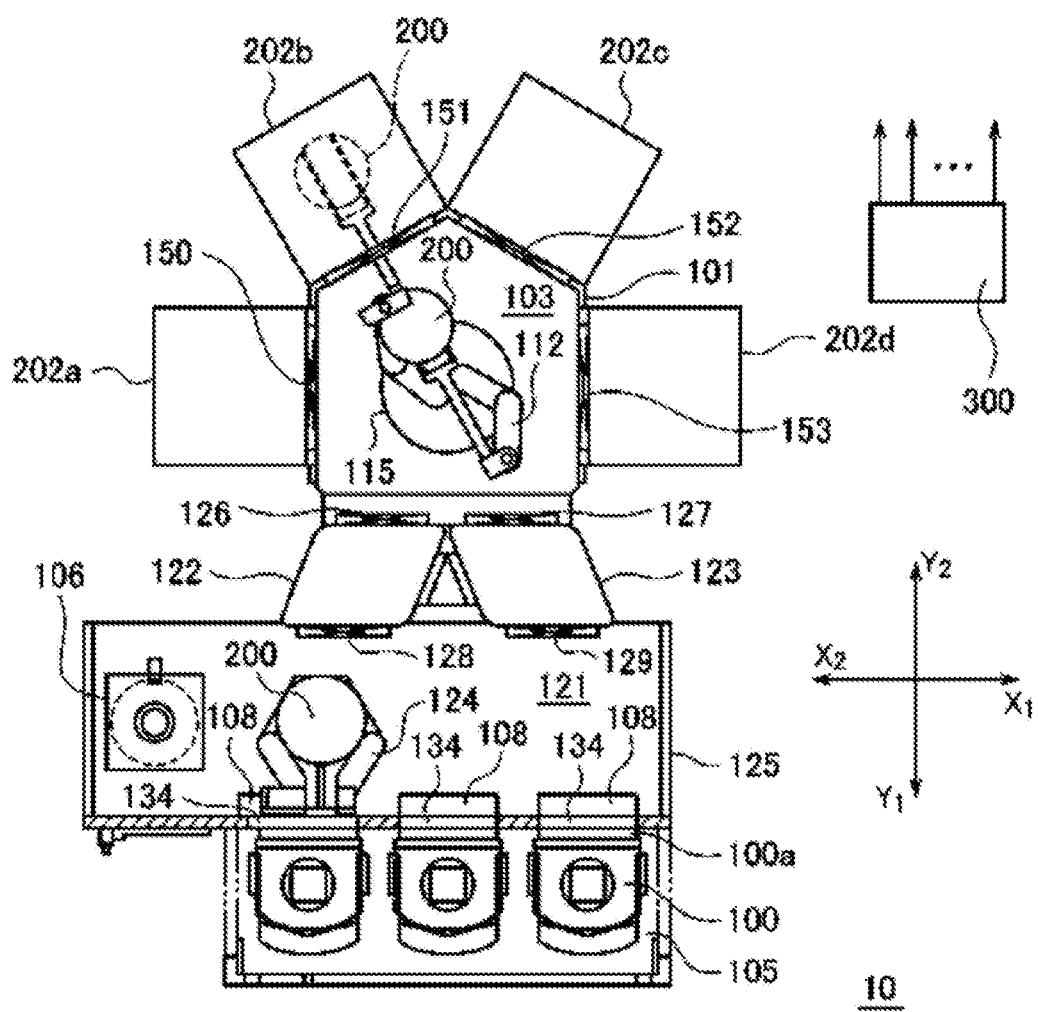
FIG. 1 is a schematic cross-sectional view of a cluster type substrate processing apparatus according to a first embodiment of the present disclosure.
Figure 2:
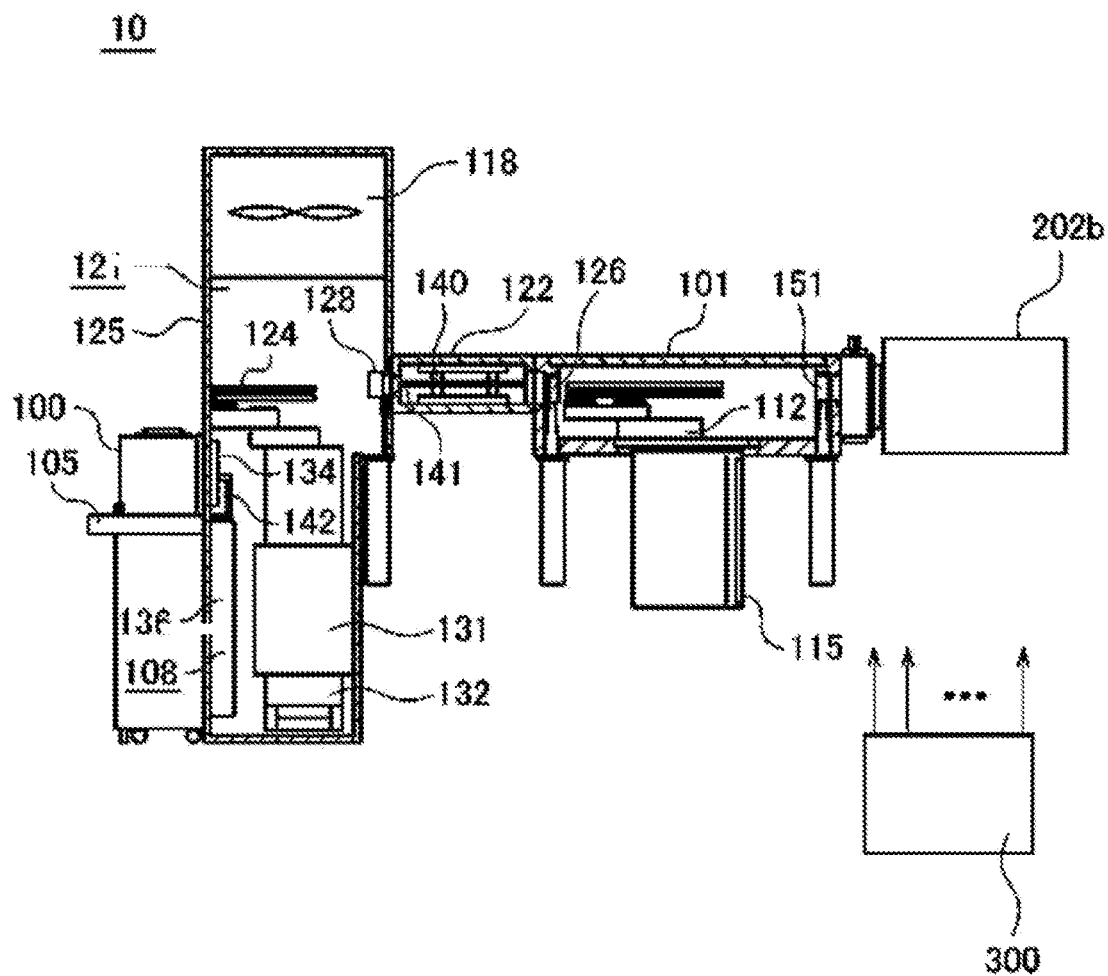
FIG. 2 is a schematic vertical sectional view of the cluster type substrate processing apparatus according to the first embodiment of the present disclosure.

A substrate processing apparatus 10 according to the present embodiment will be first described with reference to FIGS. 1 and 2. FIG. 1 is a cross-sectional view of a cluster type substrate processing apparatus 10 according to the present embodiment. FIG. 2 is a schematic vertical sectional view of the cluster type substrate processing apparatus 10 according to the present embodiment.

In the substrate processing apparatus 10 to which the present disclosure is applied, an FOUP (Front Opening Unified Pod, which will be hereinafter referred to as "pod") 100 is used as a carrier that transfers a wafer 200 as a substrate. A transfer device of the cluster type substrate processing apparatus 10 according to the present embodiment is divided into a vacuum side and an atmospheric side.

In the following descriptions, front/rear and left/right directions are defined based on the indications provided in FIG. 1. The directions X1, X2, Y1 and Y2 illustrated in FIG. 1 are assigned as right, left, front and rear directions, respectively.

(Vacuum Side Configuration)

As shown in FIGS. 1 and 2, the substrate processing apparatus 10 includes a first transfer chamber 103 capable of resisting a pressure lower than the atmospheric pressure (i.e., a negative pressure), such as a vacuum state or the like. A housing 101 of the first transfer chamber 103 has a box-shape which has, for example, a pentagonal shape when viewed from a plane, with its upper and lower ends closed. The phrase "viewed from a plane" used herein means that the substrate processing apparatus 10 is viewed from a vertical upper side toward a vertical lower side.

A first wafer transfer device 112 that is configured to simultaneously transfer two wafers 200 under the negative pressure is installed within the first transfer chamber 103. Here, the first wafer transfer device 112 may be configured to transfer a single wafer 200. The first wafer transfer device 112 is configured to be moved up and down by a first wafer transfer device elevator 115, while maintaining the airtightness of the first transfer chamber 103.

Pre-chambers (load lock chambers) 122 and 123 are connected to a front sidewall of five sidewalls of the housing 101 via gate valves 126 and 127, respectively. Each of the pre-chambers 122 and 123 is configured to be used in combination for loading and unloading the wafers 200 and to resist the negative pressure.

Within each of the pre-chambers 122 and 123, two sheets of the wafers 200 may be stacked by a substrate support table 140. A partitioning plate (intermediate plate) 141 between the wafers 200 is installed in each of the pre-chambers 122 and 123.

A first process chamber 202a, a second process chamber 202b, a third process chamber 202c and a fourth process chamber 202d, in which desired processes are performed on the substrates are arranged adjacent to one another and are respectively connected to four rear sidewalls of the five sidewalls of the housing 101 of the first transfer chamber 103, via gate valves 150, 151, 152 and 153. The first process chamber 202a, the second process chamber 202b, the third process chamber 202c and the fourth process chamber 202d will be described in more detail later.

(Atmosphere Side Configuration)

A second transfer chamber 121 in which the wafers 200 may be transferred under a vacuum pressure and an atmospheric pressure is connected to the front sides of the pre-chambers 122 and 123 via gate valves 128 and 129. A second wafer transfer device 124 for transferring the wafers 200 is installed in the second transfer chamber 121. The second wafer transfer device 124 is configured to be moved up and down by a second wafer transfer device elevator 131 installed within the second transfer chamber 121 and to be enabled to reciprocate in a left-right direction by a linear actuator 132

A notch aligning device 106 is installed on the left side of the second transfer chamber 121. The notch aligning device 106 may be an orientation flat aligning device. In addition, a clean unit 118 for supplying clean air is installed at the top of the second transfer chamber 121.

Substrate loading/unloading ports 134 for loading/unloading the wafers 200 into/from the second transfer chamber 121, and respective pod openers 108 are installed in the front side of a housing 125 of the second transfer chamber 121. A load port (IO stage) 105 is installed in the opposite side of the pod openers 108, that is, in the outside of the housing 125, with the substrate loading/unloading ports 134 interposed therebetween. Each of the pod openers 108 includes a closure 142 that is capable of opening/closing a cap 100a of a pod 100 and blocking each substrate loading/unloading port 134, and a drive mechanism 136 for driving the closure 142. By opening/closing the cap 100a of the pod 100 mounted on the load port 105, it becomes possible to load/unload the wafers 200 into/from the pod 100. In addition, the pod 100 may be supplied in and discharged from the load port 105 by an intra-process transfer device (e.g., an OHT or the like) not shown in the drawings.

(2) Configuration of Process Chamber

Figure 3:
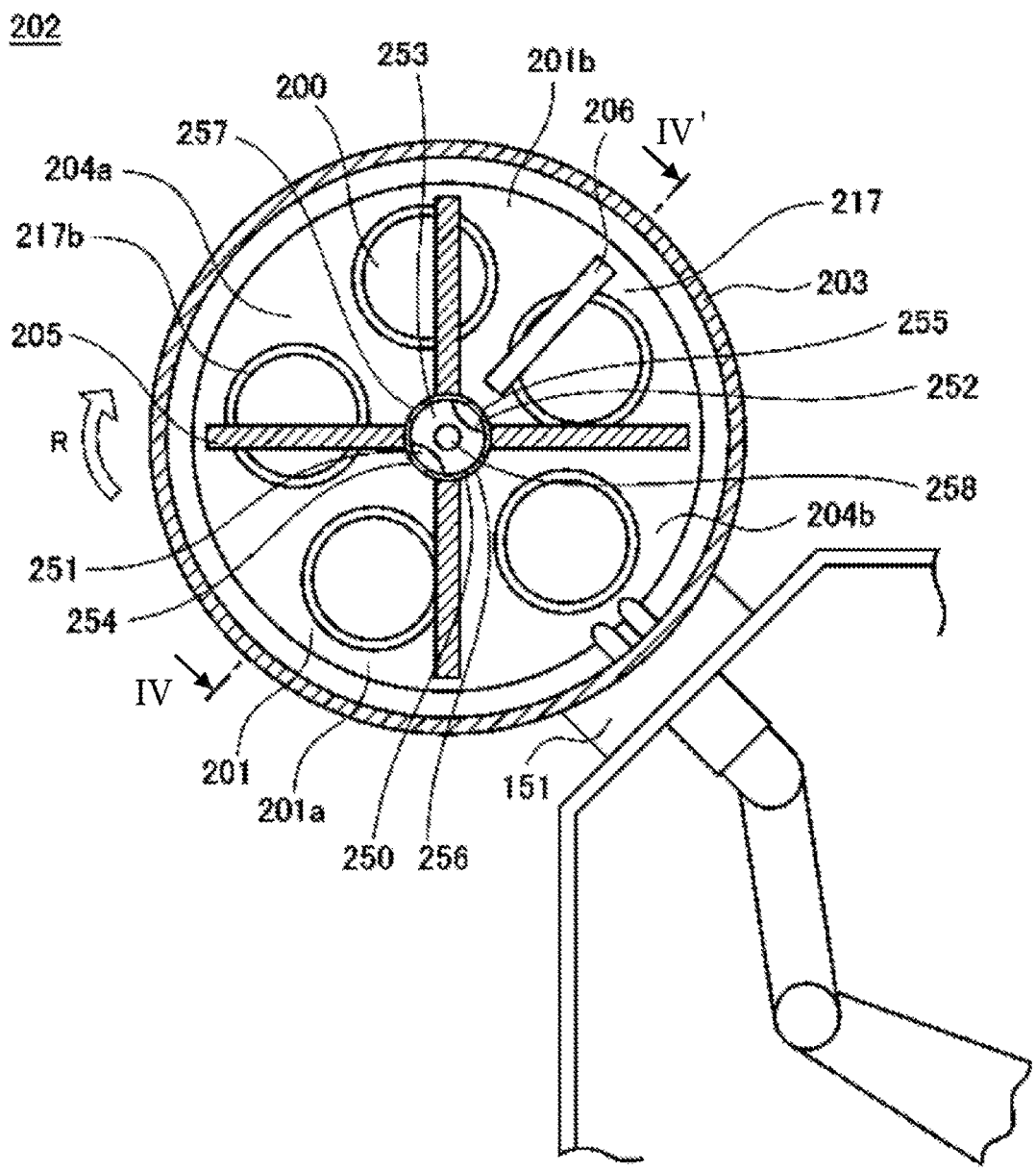
FIG. 3 is a schematic cross-sectional view of a process chamber of the cluster type substrate processing apparatus according to the first embodiment of the present disclosure.
Figure 4:
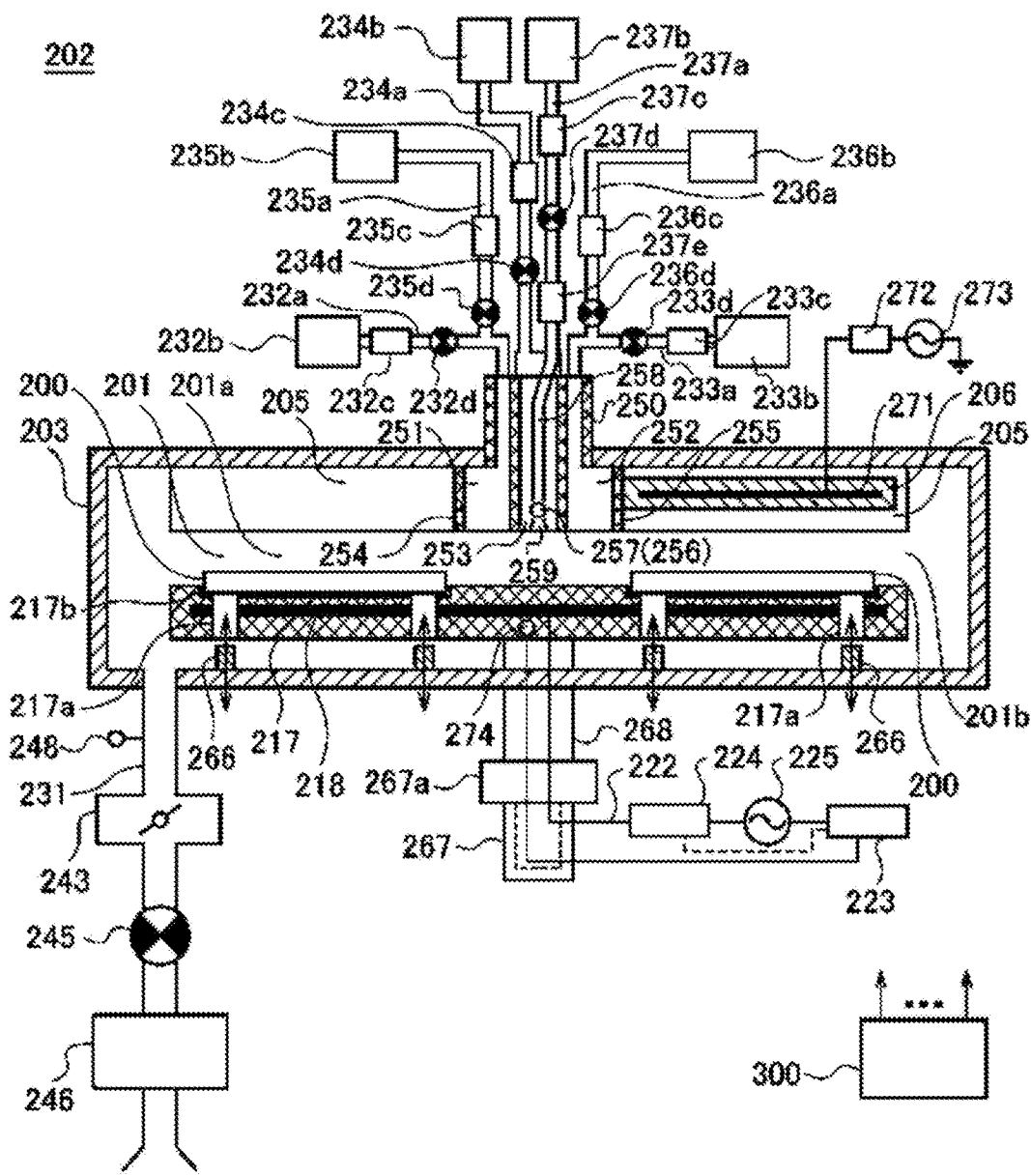
FIG. 4 is a schematic vertical sectional view of the process chamber of the cluster type substrate processing apparatus according to the first embodiment of the present disclosure, which is taken along line IV-IV' in FIG. 3.

Subsequently, the configuration of the process chamber as a processing furnace according to the present embodiment will be described mainly with reference to FIGS. 3 and 4. FIG. 3 is a schematic cross-sectional view of the process chamber of the substrate processing apparatus 10 according to the present embodiment. FIG. 4 is a schematic vertical sectional view of the process chamber of the substrate processing apparatus 10 according to the present embodiment, which is taken along line A-A' in FIG. 3.

In the present embodiment, for example, the first process chamber 202a, the second process chamber 202b, the third process chamber 202c and the fourth process chamber 202d have substantially the same configuration. In the following descriptions, the first process chamber 202a, the second process chamber 202b, the third process chamber 202c and the fourth process chamber 202d will be generically referred to as a "process chamber 202".

(Processing Chamber)

As illustrated in FIGS. 3 and 4, the process chamber 202 serving as the processing furnace includes a cylindrical sealed reaction container 203. The reaction container 203 is provided with a processing chamber 201 for processing the wafers 200.

Four partitioning plates 205 radially extending from a central portion are installed at the upper side of the reaction container 203. The four partitioning plates 205 are installed to block a space extending from the ceiling of the processing chamber 201 to just above a susceptor 217 within the processing chamber 201. Thus, the four partitioning plates 205 are configured to partition the processing chamber 201 into a first processing region 201a, a first purge region 204a, a second processing region 201b and a second purge region 204b. Furthermore, the first processing region 201a, the first purge region 204a, the second processing region 201b and the second purge region 204b are arranged in this order along a rotation direction R of the susceptor (substrate mounting table) 217 that will be described later.

As will be described later, a first-element-containing gas that contains a first element is supplied into the first processing region 201a. A second-element-containing gas that contains a second element is supplied into the second processing region 201b. An inert gas is supplied into the first purge region 204a and the second purge region 204b.

A time for which the wafers 200 pass through each of the first processing region 201a, the first purge region 204a, the second processing region 201b and the second purge region 204b, i.e., a processing time of the wafers 200 in each region, depends on the area of each of the first processing region 201a, the first purge region 204a, the second processing region 201b and the second purge region 204b. That is to say, the processing time of the wafers 200 in each region depends on the arrangement of the partitioning plates 205. For example, the four partitioning plates 205 are symmetrically disposed with respect to the center of the reaction container 203 when viewed from a plan view. Furthermore, for example, the respective partitioning plates 205 are disposed to form an angle of 90° with one another. Thus, the processing times of the wafers 200 in the respective regions remain substantially the same.

The lower ends of the partitioning plates 205 are disposed in proximity to the susceptor 217 so as not to interfere with the wafers 200. Thus, gases passing between the partitioning plates 205 and the susceptor 217 are decreased to prevent the different gases from being mixed among the respective regions.

An opening having a predetermined width is formed between an end portion of each of the partitioning plates 205 and the sidewall of the reaction container 203 so that gases can pass through the gap. Through this opening, an inert gas can be ejected from the interior of the first purge region 204a and the interior of the second purge region 204b toward the interior of the first processing region 201a and the interior of the second processing region 201b. Thus, it is possible to prevent the first-element-containing gas or the second-element-containing gas from entering the first purge region 204a and the second purge region 204b, thereby preventing reaction of the processing gases in the first purge region 204a and the second purge region 204b.

(Susceptor)

The susceptor 217 as a rotatable substrate mounting table having a center of a rotary shaft at the center of the reaction container 203 is installed below the partitioning plates 205, i.e., the bottom-side center in the reaction container 203. The susceptor 217 is made of, e.g., a non-metallic material, such as aluminum nitride (AlN), ceramics, quartz or the like, so as to reduce metallic contamination of the wafers 200. In addition, the susceptor 217 is electrically isolated from the reaction container 203.

The susceptor 217 is configured to support a plurality of (in the present embodiment, five) wafers 200 on the same plane along the same circumference within the reaction container 203. As used herein, the term "'the same plane'" is not limited to the completely identical plane, but is intended to allow the wafers 200 to be arranged in a non-overlapping manner when the susceptor 217 is viewed from a plan view. Furthermore, the susceptor 217 is configured to support the wafers 200 arranged along a rotation direction.

Wafer mounting members 217b are installed at supporting positions of the wafers 200 on the surface of the susceptor 217. The same number of wafer mounting members 217b as the number of the wafers 200 to be processed are arranged at positions on a same circumference from the center of the susceptor 217 with an equal interval (for example, at an interval of 72°).

Each of the wafer mounting members 217b has, for example, a circular shape when viewed from the upper surface of the susceptor 217 and a concave shape when viewed from the lateral side surface. The diameter of each wafer mounting member 217b may be slightly larger than that of each wafer 200. Mounting the wafers 200 in the wafer mounting members 217b may facilitate positioning of the wafers 200 and can prevent any dislocation of the wafers 200 which may otherwise occur, for example, when the wafers 200 are dislocated out of the susceptor 217 due to a centrifugal force caused by the rotation of the susceptor 217.

The susceptor 217 is provided with an elevating mechanism 268 to elevate the susceptor 217 up and down. Each of the wafer mounting members 217b of the susceptor 217 is provided with a plurality of through holes 217a. On the bottom surface of the aforementioned reaction container 203, there is installed a plurality of wafer pushup pins 266 that pushes up the wafers 200 and supports the rear surfaces of the wafers 200 when the wafers 200 are loaded/unloaded into/out of the reaction container 203. The through holes 217a and the wafer pushup pins 266 are arranged in such a relationship that the wafer pushup pins 266 pass through the through holes 217a without making contact with the susceptor 217 when the wafer pushup pins 266 are moved up or when the susceptor 217 is moved down by the elevating mechanism 268.

A rotating mechanism 267 configured to rotate the susceptor 217 is installed in the elevating mechanism 268. A rotation shaft (not illustrated) of the rotating mechanism 267 is connected to the susceptor 217. The susceptor 217 can be rotated by operating the rotating mechanism 267. Furthermore, the five wafer mounting members 217b are configured to simultaneously rotate as the susceptor 217 is rotated.

A controller 300 to be described later is connected to the rotating mechanism 267 via a coupling unit 267a. The coupling unit 267a is formed as, for example, a slip ring mechanism to electrically interconnect a rotating side and a fixed side using a metal brush or the like. Thus, the rotation of the susceptor 217 is not disturbed. The controller 300 is configured to control a state of electrical conduction to the rotating mechanism 267 so as to rotate the susceptor 217 at a predetermined speed for a predetermined time.

As described above, by rotating the susceptor 217, the wafers 200 mounted on the susceptor 217 pass through the first processing region 201a, the first purge region 204a, the second processing region 201b and the second purge region 204b in this order.

(Heating Unit)

A heater 218 as a heating unit is unitarily embedded in the susceptor 217 to heat the wafers 200. When supplied with electric power, the heater 218 is configured to heat the surfaces of the wafers 200 to a predetermined temperature (e.g., from room temperature to about 1,000 degrees C.). A plurality of (e.g., five) heaters may be installed on the same plane so as to independently heat the respective wafers 200 mounted on the susceptor 217.

A temperature sensor 274 is installed in the susceptor 217. A power conditioner 224, a heater power source 225 and a temperature adjustor 223 are electrically connected to the heater 218 and the temperature sensor 274 via a power supply line 222. A state of the power supply to the heater 218 is controlled based on the temperature information detected by the temperature sensor 274.

(Gas Supply Unit)

In the central region of the ceiling of the reaction container 203, there is installed a gas supply unit 250 that includes a first-element-containing gas supply unit 251, a second-element-containing gas supply unit 252, an inert gas supply unit 253 and a cleaning gas supply unit 258. The upper end of the gas supply unit 250 is air-tightly connected to an opening formed in the ceiling portion of the reaction container 203.

The gas supply unit 250 has, for example, a tubular shape. The interior of the gas supply unit 250 is partitioned into respective gas supply units. For example, the first-element-containing gas supply unit 251 is installed in the first processing region 201a within the gas supply unit 250. The second-element-containing gas supply unit 252 spaced apart from the first-element-containing gas supply unit 251 is installed in the second processing region 201b within the gas supply unit 250. The inert gas supply unit 253 is installed between the first-element-containing gas supply unit 251 and the second processing region 201b within the gas supply unit 250. The cleaning gas supply unit 258 is disposed at the center of the inert gas supply unit 253 and between the first-element-containing gas supply unit 251 and the second-element-containing gas supply unit 252.

A first gas injection hole 254 opened toward the first processing region 201a is formed in the sidewall of the first-element-containing gas supply unit 251 facing the first processing region 201a. A second gas injection hole 255 opened toward the second processing region 201b is formed in the sidewall of the second-element-containing gas supply unit 252 facing the second processing region 201b.

A first inert gas injection hole 256 opened toward the first purge region 204a and a second inert gas injection hole 257 opened toward the second purge region 204b are respectively formed in the sidewall of the inert gas supply unit 253 facing the first purge region 204a and in the sidewall of the inert gas supply unit 253 facing the second purge region 204b.

A cleaning gas supply hole 259, which is an end portion of the cleaning gas supply unit 258, is formed in the bottom of the gas supply unit 250. That is, the cleaning gas supply hole 259 is formed to be lower than the first gas injection hole 254, the second gas injection hole 255 and the inert gas injection holes 256 and 257.

The gas supply unit 250 is configured to supply the first-element-containing gas from the first-element-containing gas supply unit 251 into the first processing region 201a, to supply the second-element-containing gas from the second-element-containing gas supply unit 252 into the second processing region 201b, to supply the inert gas from the inert gas supply unit 253 into the first purge region 204a and the second purge region 204b, and to supply the cleaning gas from the cleaning gas supply unit 258 toward the substantially entire region within the processing chamber 201. The gas supply unit 250 is configured to supply different gases to the respective regions either individually, without mixing them, or in parallel.

(Processing Gas Supply System)

The downstream end of a first gas supply pipe 232a is connected to the upper end of the first-element-containing gas supply unit 251. From the upstream side of the first gas supply pipe 232a are installed a first gas supply source 232b, a mass flow controller (MFC) 232c as a flow rate controller (flow rate control part), and a valve 232d as an opening/closing valve in this order.

A gas containing a first element (hereinafter referred to as a "first-element-containing gas") is supplied from the first gas supply pipe 232a into the first processing region 201a via the mass flow controller 232c, the valve 232d, the first-element-containing gas supply unit 251 and the first gas injection hole 254.

The first-element-containing gas is a precursor gas, namely one of the processing gases.

In the present embodiment, the first element may be, e.g., silicon (Si). That is to say, the first-element-containing gas may be, e.g., a silicon-containing gas. As an example, the silicon-containing gas may include, e.g., a $SiH_2(NH(C_4H_9))_2$ (bis(tertiary-butyl-amino)silane, abbreviation: BTBAS) gas. Furthermore, the first-element-containing gas may be any of solid, liquid and gas under room temperature and atmospheric pressure. If the first-element-containing gas is in a liquid phase under room temperature and atmospheric pressure, a vaporizer (not illustrated) may be installed between the first gas supply source 232b and the mass flow controller 232c. In the present embodiment, the first-element-containing gas will be described to be a gas.

Furthermore, as the silicon-containing gas, in addition to BTBAS, it may be possible to use, e.g., hexamethyldisilazane ($C_6H_{19}NSi_2$, abbreviation: HMDS) or trisilylamine (($SiH_3)_3N$, abbreviation: TSA), which is an organic silicon material. These gases act as a precursor. In addition, the first-element-containing gas includes a material having a viscosity higher than the second-element-containing gas described later.

The downstream end of a second gas supply pipe 233a is connected to the upper end of the second-element-containing gas supply unit 252. From the upstream side of the second gas supply pipe 233a are installed a second gas supply source 233b, a mass flow controller (MFC) 233c as a flow rate controller (flow rate control part), and a valve 233d as an opening/closing valve.

A gas containing a second element (hereinafter referred to as a "second-element-containing gas") is supplied from the second gas supply pipe 233a into the second processing region 201b via the mass flow controller 233c, the valve 233d, the second-element-containing gas supply unit 252 and the second gas injection hole 255. The second-element-containing gas is converted into a plasma state by a plasma generating unit 206 and is irradiated onto the wafers 200.

The second-element-containing gas is one of the processing gases. The second-element-containing gas may be regarded as a reaction gas or a modifying gas.

In the present embodiment, the second-element-containing gas contains a second element differing from the first element. The second element may be, for example, one of oxygen (O), nitrogen (N) and carbon (C). In the present embodiment, it is assumed that the second-element-containing gas is, e.g., an oxygen-containing gas. Specifically, an oxygen ($O_2$) gas is used as the oxygen-containing gas. Furthermore, an ozone ($O_3$) gas or water vapor ($H_2O$) may be used as the oxygen-containing gas. In addition, the second-element-containing gas includes a material having viscosity lower than the first-element-containing gas.

A first-element-containing gas supply system (also referred to as a silicon-containing gas supply system) is mainly configured by the first gas supply pipe 232a, the mass flow controller 232c, the valve 232d, the first-element-containing gas supply unit 251 and the first gas injection hole 254. Furthermore, the first-element-containing gas supply system may include the first gas supply source 232b. A second-element-containing gas supply system (also referred to as an oxygen-containing gas supply system) is mainly configured by the second gas supply pipe 233a, the mass flow controller 233c, the valve 233d, the second-element-containing gas supply unit 252 and the second gas injection hole 255. Furthermore, the second-element-containing gas supply system may include the second gas supply source 233b. A processing gas supply system is mainly configured by the first-element-containing gas supply system and the second-element-containing gas supply system.

(Inert Gas Supply System)

The downstream end of a first inert gas supply pipe 234a is connected to the upper end of the inert gas supply unit 253. From the upstream side of the first inert gas supply pipe 234a, an inert gas supply source 234b, a mass flow controller (MFC) 234c as a flow rate controller (flow rate control part), and a valve 234d as an opening/closing valve are installed in this order.

An inert gas is supplied from the first inert gas supply pipe 234a into the first purge region 204a and the second purge region 204b via the mass flow controller 234c, the valve 234d, the inert gas supply unit 253, the first inert gas injection hole 256 and the second inert gas injection hole 257. The inert gas supplied into the first purge region 204a and the second purge region 204b acts as a purge gas in a thin film forming process (S104) described later.

The downstream end of a second inert gas supply pipe 235a is connected to the first gas supply pipe 232a at the downstream side of the valve 232d. From the upstream side of the second inert gas supply pipe 235a, an inert gas supply source 235b, a mass flow controller (MFC) 235c as a flow rate controller (flow rate control part), and a valve 235d as an opening/closing valve are installed in this order.

An inert gas is supplied from the second inert gas supply pipe 235a into the first processing region 201a via the mass flow controller 235c, the valve 235d, the first gas supply pipe 232a, the first-element-containing gas supply unit 251 and the first gas injection hole 254. The inert gas supplied into the first processing region 201a acts as a carrier gas or a dilution gas at the thin film forming process (S104).

The downstream end of a third inert gas supply pipe 236a is connected to the second gas supply pipe 233a at the downstream side of the valve 233d. From the upstream side of the third inert gas supply pipe 236a, an inert gas supply source 236b, a mass flow controller 236c as a flow rate controller (flow rate control part), and a valve 236d as an opening/closing valve are installed in this order.

An inert gas is supplied from the third inert gas supply pipe 236a into the second processing region 201b via the mass flow controller 236c, the valve 236d, the second gas supply pipe 233a, the second-element-containing gas supply unit 252 and the second gas injection hole 255. Similar to the inert gas supplied into the first processing region 201a, the inert gas supplied into the second processing region 201b acts as a carrier gas or a dilution gas at the thin film forming process (S104).

In the present embodiment, the inert gas may be, e.g., a nitrogen ($N_2$) gas. As the inert gas, in addition to the $N_2$ gas, it may be possible to use, e.g., a rare gas such as a helium (He) gas, a neon (Ne) gas, an argon (Ar) gas or the like.

A first inert gas supply system is mainly configured by the first inert gas supply pipe 234a, the mass flow controller 234c, the valve 234d, the inert gas supply unit 253, the first inert gas injection hole 256 and the second inert gas injection hole 257. Furthermore, the first inert gas supply system may include the inert gas supply source 234b.

A second inert gas supply system is mainly configured by the second inert gas supply pipe 235a, the mass flow controller 235c and the valve 235d. Furthermore, the second inert gas inert supply system may include the inert gas supply source 235b, the first gas supply pipe 232a, the first-element-containing gas supply unit 251 and the first gas injection hole 254.

A third inert gas supply system is mainly configured by the third inert gas supply pipe 236a, the mass flow controller 236c and the valve 236d. Furthermore, the third inert gas supply system may include the inert gas supply source 236b, the second gas supply pipe 233a, the second-element-containing gas supply unit 252 and the second gas injection hole 255.

An inert gas supply system is mainly configured by the first inert gas supply system, the second inert gas supply system and the third inert gas supply system.

(Cleaning Gas Supply System)

The downstream end of a cleaning gas supply pipe 237a is connected to the upper end of the cleaning gas supply unit 258. From the upstream side of the cleaning gas supply pipe 237a, a cleaning gas supply source 237b, a mass flow controller (MFC) 237c as a flow rate controller (flow rate control part), a valve 237ds as an opening/closing valve, and a plasma generating unit 237e for generating plasma of a cleaning gas in this order.

A cleaning gas is supplied from the first gas supply pipe 232a. The cleaning gas is supplied to the reaction container 203 via the mass flow controller 237c, the valve 237d, the remote plasma generating unit 237e, the cleaning gas supply unit 258 and the cleaning gas supply hole 259. Byproducts within the reaction container 203 are cleaned by the cleaning gas converted into a plasma state by the remote plasma generating unit 237e.

In the present embodiment, the cleaning gas may be, e.g., a nitrogen trifluoride ($NF_3$) gas. As the cleaning gas, it may be possible to use, e.g., a hydrogen fluoride (HF) gas, a chlorine trifluoride ($ClF_3$) gas and a fluorine ($F_3$) gas. These gases may be used in combination. In addition, the cleaning gas may be supplied together with the inert gas (e.g., a nitrogen gas) as a dilution gas.

(Exhaust System)

As illustrated in FIG. 4, an exhaust pipe 231 for exhausting the interior of the reaction container 203 is installed in the bottom portion of the reaction container 203. A vacuum pump 246 as a vacuum exhauster is connected to the exhaust pipe 231 via a pressure sensor 248, an APC (Auto Pressure Controller) valve 243 as a pressure regulator (pressure regulating part) and a valve 245 as an opening/closing valve. The vacuum pump 246 is configured to perform vacuum exhaust so that the internal pressure of the processing chamber 201 becomes a predetermined pressure (vacuum level). The APC valve 243 is an opening/closing valve that facilitates or stops the vacuum exhaust in the interior of the processing chamber 201 by opening/closing the valve and that adjust the internal pressure of the processing chamber 201 by regulating the degree of valve opening. An exhaust system is mainly configured by the exhaust pipe 231, the APC valve 243 and the valve 245. Furthermore, the exhaust system may include the pressure sensor 248 and the vacuum pump 246.

(Plasma Generating Unit)

Electrodes 271 forming at least a portion of the plasma generating unit 206 are installed in the upper side of the second processing region 201b. The plasma generating unit 206 is configured to generate plasma of the second-element-containing gas (to activate the second-element-containing gas) in the second processing region 201b. By using the plasma in this way, it is possible to activate the second-element-containing gas to process the wafers 200 even when the temperature is low.

For example, a pair of rod-shaped electrodes 271 arranged side by side in a mutually parallel relationship is installed in the second processing region 201b. The two electrodes 271 are covered with, e.g., a quartz-made cover (not illustrated). A high-frequency power source 273 is connected to the electrodes 271 via a matcher 272 for matching impedance. When high frequency power is applied from the high-frequency power source 273 to the electrodes 271, plasma is generated in the vicinity of the electrodes 271. In addition, the plasma is mainly generated immediately below the electrodes 271. In this way, the plasma generating unit 206 generates so-called capacitively-coupled plasma.

For example, the electrodes 271 of the plasma generating unit 206 are disposed to extend outward from the center of the reaction container 203 when viewed from a plan view. In other words, the electrodes 271 are installed to radially extend from the center of the reaction container 203 when viewed from a plan view. The electrodes 271 are installed in a parallel relationship with the upper surfaces of the wafers 200. Furthermore, the electrodes 271 are disposed on a path through which the wafers 200 pass. The length of the electrodes 271 is longer than the diameter of the wafers 200. Thus, the plasma is sequentially irradiated on the entire surfaces of the wafers 200 passing immediately below the electrodes 271.

The plasma generating unit 206 is mainly configured by the electrodes 271. The plasma generating unit 206 may include the matcher 272 and the high-frequency power source 273.

(Control Part)

Figure 5:
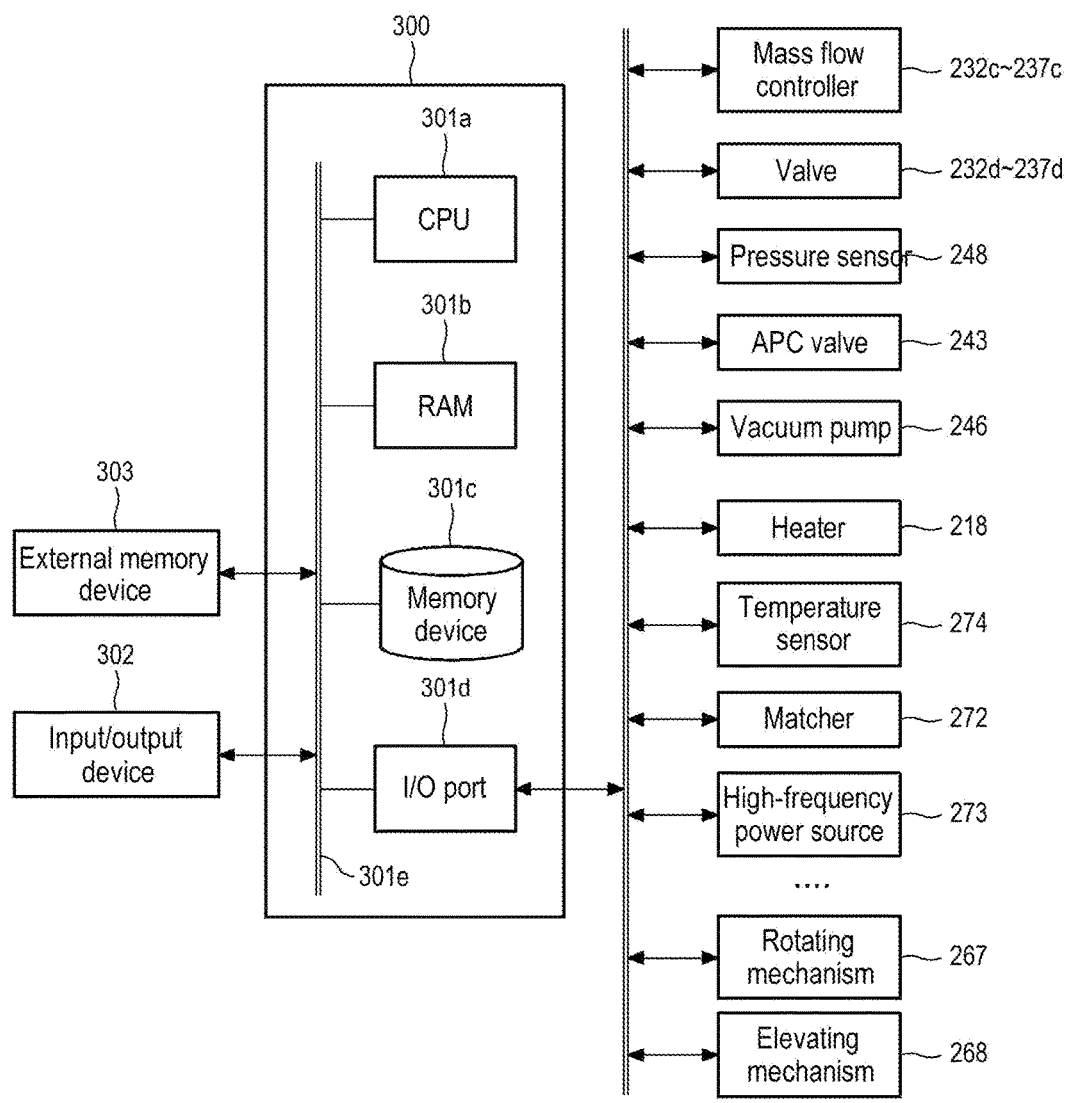
FIG. 5 is a schematic configuration view of a controller of the substrate processing apparatus, which is suitably used in the first embodiment of the present disclosure.

Next, the controller 300, which is a control part (control means) of the present embodiment, will be described with reference to FIG. 5. FIG. 5 is a schematic configuration view of the controller of the substrate processing apparatus 10 that is suitably used in the present embodiment.

As illustrated in FIG. 5, the controller 300, which is a control part (control means), is configured as a computer including a central processing unit (CPU) 301a, a random access memory (RAM) 301b, a memory device 301c and an I/O port 301d. The RAM 301b, the memory device 301c and the I/O port 301d are configured to exchange data with the CPU 301a via an internal bus 301e. An input/output device 302 including, for example, a touch panel or the like, is connected to the controller 300.

The memory device 301c is configured with, for example, a flash memory, a hard disk drive (HDD), or the like. A control program for controlling operation of the substrate processing apparatus 10 or a process recipe, in which the below-described procedures or conditions of a substrate processing, such as film formation, are written, is readably stored in the memory device 301c. The process recipe is combined to obtain a predetermined result by causing the controller 300 to execute each sequence in the substrate processing process described later. The process recipe functions as a program. Hereinafter, the process recipe and the control program will also be generally referred to as a "program." When the term "program" is used herein, it may include a case in which only the process recipe is included, a case in which only the control program is included, or a case in which both of the process recipe and the control program are included. In addition, the RAM 301b is configured as a memory area (work area) that temporarily stores a program or data that is read by the CPU 301a.

The I/O port 301d is connected to the mass flow controllers 232c, 233c, 234c, 235c, 236c and 237c, the valves 232d, 233d, 234d, 235d, 236e and 237f, the pressure sensor 248, the APC valve 243, the vacuum pump 246, the heater 218, the temperature sensor 274, the matcher 272, the high-frequency power source 273, the rotating mechanism 267, the elevating mechanism 268, and the like. The I/O port 301d is also connected to the power conditioner 224, the heater power source 225 and the temperature adjustor 223, which are not illustrated in FIG. 5.

The CPU 301a is configured to read and execute the control program from the memory device 301c. Furthermore, the CPU 301a is configured to read the process recipe from the memory device 301c in response to an input of an operation command from the input/output device 302. In addition, the CPU 301a is configured to control a flow rate controlling operation of various kinds of gases by the mass flow controllers 232c, 233c, 234c, 235c, 236c and 237c, an opening/closing operation of the valves 232d, 233d, 234d, 243f, 235d, 236e and 237e, an opening/closing operation of the APC valve 243, a pressure adjusting operation by the APC valve 243 based on the pressure sensor 248, a temperature adjusting operation of the heater 218 based on the temperature sensor 274, a starting and stopping operation of the vacuum pump 246, a rotating operation and a rotation speed adjusting operation of the susceptor 217 by the rotating mechanism 267, an elevating operation of the susceptor 217 by the elevating mechanism 268, a power supplying/stopping operations by the high-frequency power source 273 and an impedance adjusting operation by the matcher 272, and the like, according to contents of the process recipe read as above.

The controller 300 is not limited to being configured as a dedicated computer but may be configured as a general-purpose computer. For example, the controller 300 according to the present embodiment may be configured by preparing an external memory device 303 (for example, a magnetic tape, a magnetic disc such as a flexible disc or a hard disc, an optical disc such as a CD or a DVD, a magneto-optical disc such as an MO, or a semiconductor memory such as a USB memory or a memory card) that stores the aforementioned program, and installing the program on the general-purpose computer using the external memory device 303. However, a means for supplying a program to a computer is not limited to a case in which the program is provided through the external memory device 303. For example, the program may be supplied using a communication means such as Internet or a dedicated line, rather than through the external memory device 303. The memory device 301c or the external memory device 303 is configured as a non-transitory computer-readable recording medium. Hereinafter, the means for supplying the program will be generally and simply referred to as a "recording medium." When the term "recording medium" is used herein, it may indicate a case in which only the memory device 301c is included, a case in which only the external memory device 303 is included, or a case in which both the memory device 301c and the external memory device 303 are included.

(3) Substrate Processing Process

Next, as one process of the semiconductor manufacturing method according to the present embodiment, a substrate processing process performed using the substrate processing apparatus 10 provided with the process chamber 202 will be described.

Figure 6:
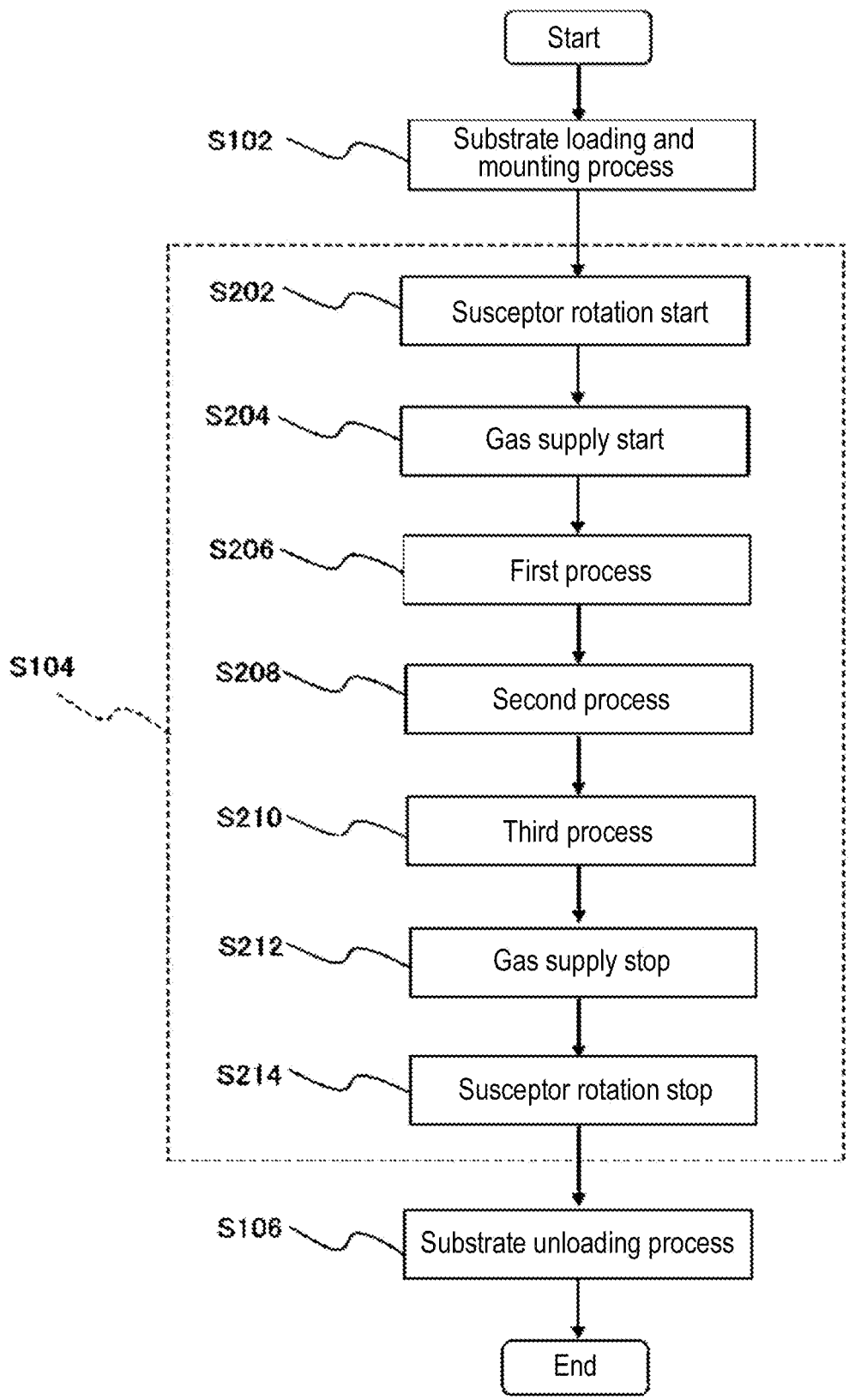
FIG. 6 is a flowchart illustrating a substrate processing process according to the first embodiment of the present disclosure.

First, the outline of the substrate processing process will be described with reference to FIGS. 6 and 7. FIG. 6 is a flowchart illustrating the substrate processing process according to the present embodiment. FIG. 7 is a flowchart of a second process according to the present embodiment. In the following descriptions, operations of various components of the process chamber 202 of the substrate processing apparatus 10 are controlled by the controller 300.

An example of forming a silicon oxide film as a thin film on the wafer 200 by using a BTBAS gas as the first-element-containing gas and an oxygen ($O_2$) gas as the second-element-containing gas will be described below. For example, some films may be previously formed on the wafer 200. Furthermore, some patterns may be also previously formed on the wafer 200 or the films thereon.

(Substrate Loading and Mounting Process: S102)

The pod 100 accommodating up to 25 sheets of the wafers 200 therein is, for example, transferred by the intra-process transfer device and is mounted on the load port 105. The cap 100a of the pod 100 is removed by the pod opener 108, whereby the substrate entrance of the pod 100 is opened. The second wafer transfer device 124 picks up one of the wafers 200 from the pod 100 and mounts the wafer 200 on the notch aligning device 106. The notch aligning device 106 performs position adjustment of the wafer 200. The second wafer transfer device 124 carries the wafer 200 from the notch aligning device 106 into the pre-chamber 122 under an atmosphere pressure. The gate valve 128 is closed and the interior of the pre-chamber 122 is exhausted to a negative pressure by an exhaust device (not illustrated).

In the process chamber 202, by descending the susceptor 217 to the transfer position of the wafers 200, the wafer pushup pins 266 are allowed to pass through the through holes 217a of the susceptor 217. As a result, the wafer pushup pins 266 protrude beyond the surface of the susceptor 217 by a predetermined height. Then, a certain gate valve is opened so that a predetermined number of (e.g., five) wafers 200 (substrates to be processed) are loaded into the processing chamber 201 using the first wafer transfer device 112. The waters 200 are mounted around the rotation shaft (not illustrated) of the susceptor 217 along the rotation direction of the susceptor 217 in a non-overlapping manner. Thus, the waters 200 are horizontally supported on the wafer pushup pins 266 protruding from the surface of the susceptor 217.

After the wafers 200 are loaded into the processing chamber 201, the first wafer transfer device 112 is evacuated out of the process chamber 202 and a predetermined gate valve is closed to hermetically seal the interior of the reaction container 203. Thereafter, the susceptor 217 is moved upward to mount the wafers 200 on the respective wafer mounting members 217b formed in the susceptor 217.

When the wafers 200 are loaded into the processing chamber 201, an $N_2$ gas as an inert gas may be supplied from the inert gas supply system into the processing chamber 201 while exhausting the interior of the processing chamber 201 by means of the exhaust system. That is to say while exhausting the interior of the processing chamber 201 by operating the vacuum pump 246 and opening the APC valve 243, the $N_2$ gas may be supplied into the processing chamber by opening at least the valve 234d of the first inert gas supply system. Thus, it is possible to restrain particles from infiltrating into the processing chamber 201 and adhering onto the wafers 200. Here, the inert gas may be supplied from the second inert gas supply system and the third inert gas supply system. The vacuum pump 246 keeps actuated until at least the substrate loading and mounting process (S102) to a substrate unloading process (S106) described below are terminated.

When the wafers 200 are mounted on the susceptor 217, electric power is supplied to the heater 218 embedded within the susceptor 217 so that the surfaces of the wafers 200 are heated to a predetermined temperature. The temperature of the wafers 200 may be, for example, from room temperature to 700 degrees C., specifically from room temperature to 200 degrees C. In this case, the temperature of the heater 218 is regulated by controlling the state of power supply to the heater 218 based on the temperature information detected by the temperature sensor 274.

When heating the wafers 200 composed of silicon, if the surfaces of the wafer are heated to a temperature of 750 degrees C. or higher, diffusion of impurities may occur in source or drain regions on the surfaces of the wafers 200 so that the circuit characteristics may deteriorate and the performance of the semiconductor device may be reduced. By limiting the temperature of the wafers 200 as described above, it is possible to suppress the diffusion of impurities in source or drain regions on the surfaces of the wafers 200, deterioration of the circuit characteristics and reduction of the semiconductor device performance.

In a case of forming a thin film on a photoresist pattern previously formed on the wafers 200, as in the below-described double patterning method, the photoresist pattern may be thermally changed if the temperature of the wafers 200 reaches a high temperature of e.g., 200 degrees C. or higher. In the present embodiment, it is possible to suppress deterioration of the photoresist film because a substrate processing process can be performed at a low temperature.
(Thin Film Forming Process S104)

Next, a thin film forming process S104 is performed. Here, the basic flow of the thin film forming process S104 will be described and details of characterizing features of the present embodiment will be described later.

At the thin film forming process S104, a silicon oxide film is formed on each of the wafers 200 by supplying a BTBAS gas into the first processing region 201a and supplying an oxygen gas into the second processing region 201b.

At the thin film forming process S104, subsequent to the substrate loading and mounting process S102, the interior of the processing chamber 201 is continuously exhausted by the exhaust part and a $N_2$ gas as a purge gas is supplied from the inert gas supply system into the first purge region 204a and the second purge region 204b.

(Susceptor Rotation Start S202)

First, when the wafers 200 are mounted on the respective wafer mounting members 217b, the rotation of the susceptor 217 is started by the rotating mechanism 267. At this time, the rotational speed of the susceptor 217 is controlled by the controller 300. The rotational speed of the susceptor 217 may be, for example, from 1 rpm to 100 rpm. Specifically, the rotational speed may be, for example, 60 rpm. As the susceptor 217 is rotated, the wafers 200 start to move in the order of the first processing region 201a, the first purge region 204a, the second processing region 201b and the second purge region 204b.

(Gas Supply Start S204)

If the wafers 200 are heated to reach a desired temperature and if the rotational speed of the susceptor 217 reaches a desired rotational speed, the valve 232d is opened to start the supply of the BTBAS gas into the first processing region 201a and the valve 233d is opened to supply the oxygen gas into the second processing region 201b.

At this time, the mass flow controller 232c is controlled to make the flow rate of the BTBAS gas become a predetermined flow rate. The supply flow rate of the BTBAS gas may be, for example, 100 sccm to 5,000 sccm. In the present embodiment, the BTBAS gas is continuously supplied at a constant flow rate until the below-described third process S210.

Together with the BTBAS gas, a $N_2$ gas as a carrier gas may be supplied from the second inert gas supply system.

Furthermore, the mass flow controller 232c is controlled to make the flow rate of the oxygen gas become a predetermined flow rate. The supply flow rate of the oxygen may be, for example, 100 sccm to 5,000 sccm. In the present embodiment, the oxygen gas is continuously supplied at a constant flow rate until the below-described third process S210.

Furthermore, the internal pressure of the processing chamber 201 is maintained at a predetermined pressure by appropriately adjusting the opening degree of the APC valve 243.

From the gas supply start S204, a silicon-containing layer having a predetermined thickness, as described below, begins to be formed on the surface of each of the wafers 200.

(First Process S206)

Next, after the flow rates of the BTBAS gas and the oxygen gas are stabilized, the plasma generating unit 206 starts to generate plasma of the oxygen gas in the second processing region 201b. In other words, oxygen plasma is ignited in the second processing region 201b by starting to supply electric power to the plasma generating unit 206.

Specifically, high-frequency power is applied from the high-frequency power source 273 to the electrodes 271 and impedance is matched by the matcher 272. Thus, plasma of the oxygen gas is generated under the electrodes 271 in the second processing region 201b. Active species including an oxygen element are generated in the second processing region 201b.

As described later, the silicon-containing layer begins to be modified by the plasma of the oxygen gas from the first process S206.

(Second Process S208)

Next, subsequent to the first process S206, while the plasma is continuously generated by the plasma generating unit 206, a second process S208 is performed to form a silicon oxide film containing a silicon element and an oxygen element on each of the wafers 200.

At the second process S208, the susceptor 217 continues to rotate so that the wafers 200 alternately pass through the first processing region 201a and the second processing region 201b a predetermined number of times. Specifically, the wafers 200 alternately pass through the first processing region 201a, the first purge region 204a, the second processing region 201b and the second purge region 204b in this order. Thus, one cycle including the supply of the BTBAS gas, the supply of the inert gas, the supply of the oxygen gas in a plasma state and the supply of the inert gas is sequentially performed with respect to the wafers 200.

Hereinafter, the details of the second process S208 will be described with reference to FIG. 7.

(First Processing Region Passing S302)

While the wafer 200 is passing through the first processing region 201a, the BTBAS gas is supplied to the wafer 200. As the BTBAS gas makes contact with the wafer 200, a silicon-containing layer as a "first-element-containing layer" is formed on the surface of the wafer 200.

The silicon-containing layer is formed to have a predetermined thickness and a predetermined distribution, depending on, for example, the internal pressure of the processing chamber 201, the flow rate of the BTBAS gas, the temperature of the susceptor 217 and the time required in passing through the first processing region 201a (the processing time in the first processing region 201a).

(First Purge Region Passing S304)

Next, after passing through the first processing region 201a, the wafer 200 is moved along the rotation direction R of the susceptor 217 to enter the first purge region 204a. While the wafer 200 is passing through the first purge region 204a, silicon components that have not coupled to the wafers 200 in the first processing region 201a are removed from the wafers 200 by the inert gas.

(Second Processing Region Passing S306)

Next, after passing through the first purge region 204a, the wafer 200 is moved along the rotation direction R of the susceptor 217 to enter the second processing region 201b. While the wafer 200 is passing through the second processing region 201b, the silicon-containing layer is modified by the plasma of the oxygen gas in the second processing region 201b.

As the silicon-containing layer is modified by the plasma of the oxygen gas, for example, a layer containing the silicon element and the oxygen element is formed on the wafer 200. Hereinafter, the layer containing the silicon element and the oxygen element will be simply referred to as a "modified layer".

The modified layer is formed to have a predetermined thickness, a predetermined distribution and a predetermined infiltration depth of oxygen components into the silicon-containing layer, depending on, for example, the internal pressure of the reaction container 203, the flow rate of the oxygen gas, the temperature of the susceptor 217 and the power supply state for the plasma generating unit 206.

Hereinafter, if a silicon-containing layer formed on the modified layer is further modified, it may be described as a modified layer being further formed and laminated on the modified layer. Furthermore, when the silicon-containing layer formed on the modified layer is further modified, an interface may not be formed between the lower modified layer and the upper modified layer. There may be also a case where oxygen components or the like are infiltrated into the lower modified layer beyond the upper modified layer.

(Second Purge Region Passing S308)

Next, after passing through the second processing region 201b where the plasma is ignited, the wafer 200 is moved along the rotation direction R of the susceptor 217 to enter the second purge region 204b. While the wafer 200 is passing through the second purge region 204b, oxygen components which have not coupled to the wafer 200 in the second processing region 201b are removed from the wafer 200 by the inert gas.

(Determination S310)

In the meantime, the controller 300 determines whether one cycle described above has been performed a predetermined number of times. Specifically, the controller 300 counts the revolution number of the susceptor 217.

If it is determined that the cycle has not been performed the predetermined number of times (if "No" at S310), the susceptor 217 is allowed to further rotate, thereby repeating the cycle which includes the supply of the silicon-containing gas S302, the supply of the inert gas S304, the supply of the oxygen gas in a plasma state S306 and the supply of the inert gas S308. If it is determined that the cycle has been performed the predetermined number of times (if "Yes" at S310), the second process S208 is completed.

In this way, one cycle including the supply of the first-element-containing gas S302, the supply of the inert gas S304, the supply of the second-element-containing gas converted to a plasma state S306 and the supply of the inert gas S308 is repeated the predetermined number of times.

(Third Process S210)

Next, after the second process S208, the power supply to the plasma generating unit 206 is stopped to stop the plasma generation. Even after the power supply to the plasma generating unit 206 is stopped, the supply of the first-element-containing gas to the first processing region 201a, the supply of the second-element-containing gas to the second processing region 201b, the supply of the nitrogen gas to the first purge region 204a and the second purge region 204b, as well as the rotation of the susceptor 217 are continuously performed for a predetermined time period.

In this case, although the power supply to the plasma generating unit 206 is stopped, since the active species existing in the plasma are not deactivated, the plasma continues to remain for a predetermined time period. After the power supply to the plasma generating unit 206 is stopped, the plasma gradually goes from a dense state to a sparse state. The active species existing in the plasma gradually turn to be deactivated.

(Gas Supply Stop S212)

After the third process S210, at least the valves 232d and 233d are closed to stop the supply of the first-element-containing gas and the second-element-containing gas to the first processing region 201a and the second processing region 201b.

(Susceptor Rotation Stop S214)

After the gas supply stop S212, the rotation of the susceptor 217 is stopped. Thus, the thin film forming process S104 is completed.

(Substrate Unloading Process S106)

Then, the susceptor 217 is descended so that the wafers 200 are supported on the wafer pushup pins 266 protruding from the surface of the susceptor 217. Thereafter, a predetermined gate valve is opened and the wafers 200 are unloaded out of the reaction container 203 using the first wafer transfer device 112. Thereafter, in order to complete the substrate processing process, the supply of the inert gas from the inert gas supply system into the processing chamber 201 is stopped.

Thus, the substrate processing process is completed. After completing the substrate processing process, the interior of the processing chamber 201 may be cleaned by supplying a cleaning gas from the cleaning gas supply system into the processing chamber 201.

(4) As for Details of Thin Film Forming Process

Subsequently, the first process S206 to the third process S210 of the thin film forming process S104 according to the present embodiment will be described in more detail in comparison with a comparative example.

(As for First Process)

Figure 13A:
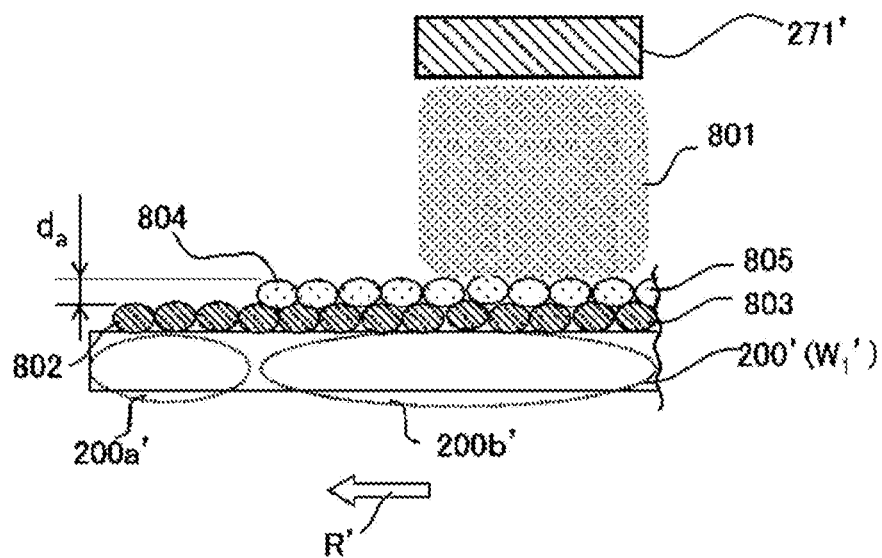
FIGS. 13A and 13B are schematic sectional views illustrating formation states of a thin film on a substrate at a thin film forming step according to a comparative example.
Figure 13B:
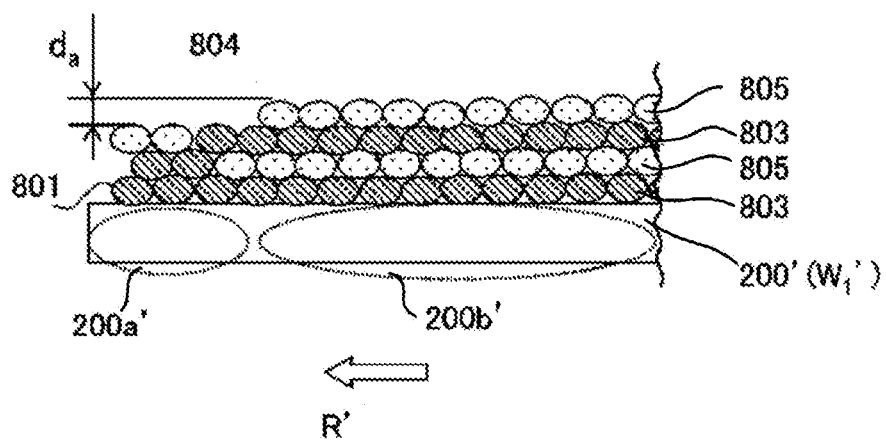

A thin film forming process according to a comparative example will be described with reference to FIGS. 13A and 13B. FIGS. 13A and 13B are schematic sectional views illustrating formation states of a thin film on a wafer 200' at a first process according to a comparative example.

In the comparative example, it is assumed that the pressure of the second processing region 201b at the first process and the pressure of the second processing region 201b at the second process are equal to each other.

In the comparative example, with gas supply start (a process corresponding to S204), for example, a silicon-containing layer 803 is formed on the wafers 200'. As described above, it is assumed that silicon components 802 generated by decomposition of a silicon-containing gas (a BTBAS gas) adhere to the wafers 200', thereby forming the silicon-containing layer 803.

Next, as illustrated in FIG. 13A, in the first process, a plasma generating unit starts to generate plasma of an oxygen gas in the second processing region 201b. In FIG. 13A, with respect to the plasma generating unit, electrodes 271' and the vicinity thereof are mainly illustrated. A plasma sheath 801 including active species of the oxygen element is generated under the plasma generating unit.

At this time, for example, it may be difficult to adjust a timing when the wafer 200' passes through a second processing region 201b' due to the high rotation speed of the susceptor. In addition, it may be changed when plasma is ignited by the plasma generating unit. Thus, the plasma generating unit may ignite the plasma while the wafer 200' is passing a region just below the plasma generating unit. In the following descriptions, among a plurality of wafers 200', the wafer initially passing the region just below the plasma generating unit when the plasma is ignited by the plasma generating unit will be referred to as a "first wafer $W_1$'".

On an area of a plane of the first wafer $W_1$' that has already passed the region just below the plasma generating unit at the ignition of the plasma, the plasma is not irradiated. On the other hand, as the wafer 200' is moved along the rotation direction R' of the susceptor, the plasma is irradiated on an area of the plane of the first wafer $W_1$' that has not yet passed the region just below the plasma generating unit at the ignition of the plasma (in other words, an area that is positioned at the downstream side of the plasma generating unit in the rotation direction and has not yet passed the region just below the plasma generating unit when the plasma is generated). For that reason, after the entirety of the first wafer $W_1'$ has passed through the second processing region 201b, both the area not irradiated with plasma (a non-plasma-irradiated area 200a') and the area irradiated with plasma (a plasma-irradiated area 200b') are generated within the plane of the first wafer $W_1'$. In the meantime, the plasma is irradiated on the entire surface of the wafers 200' following the first wafer $W_1'$.

In the non-plasma-irradiated area 200a', the surface of the silicon-containing layer 803 remains unchanged in an exposed state. On the other hand, in the plasma-irradiated area 200b', the silicon-containing layer 803 is modified by the plasma of the oxygen gas. In the plasma-irradiated area 200b', a modified layer 805 is formed as a result of the modification of the silicon-containing layer 803.

At this time, within the plane of the first wafer $W_1'$, a step difference $d_a$ may be generated between the non-plasma-irradiated area 200a' and the plasma-irradiated area 200b'. The step difference $d_a$ is a thickness of a film formed when the susceptor 217 makes one revolution and is, for example, about 1.8 Å (0.18 nm). Furthermore, a layer thickness difference corresponding to the step difference $d_a$ may be generated between the first wafer $W_1'$ and the wafers 200' other than the first wafer $W_1'$ mounted on the susceptor 217.

Thereafter, the wafer 200' alternately passes through the first processing region and the second processing region a predetermined number of times, whereby a silicon oxide film is formed on the wafer 200'. In this case, a film thickness difference corresponding to the initially-generated step difference $d_a$ remains in the thin film formed on the first wafer $W_1'$.

As described above, the non-plasma-irradiated area 200a' is generated within the plane of the first wafer $W_1'$ when the plasma is ignited. Thus, within the plane of the first wafer $W_1'$, a film thickness difference may be generated between the non-plasma-irradiated area 200a' and the plasma-irradiated area 200b'. Furthermore, a film thickness difference may be generated between the first wafer $W_1'$ and the wafers 200' other than the first wafer $W_1'$.

In recent years, there is required a wiring line dimension of, e.g., 20 nm or less. For that reason, there is a possibility that a difference in a pattern width of a wiring line may be generated even with such a small film thickness difference as described above.

Accordingly, in the present embodiment, for example, the plasma density in the second processing region 201b at the first process S206 is set to be lower than the plasma density in the second processing region 201b at the second process S208. Specifically, for example, the pressure in the second processing region 201b at the first process S206 is set to be lower than the pressure in the second processing region 201b at the second process S208.

Figure 9D:
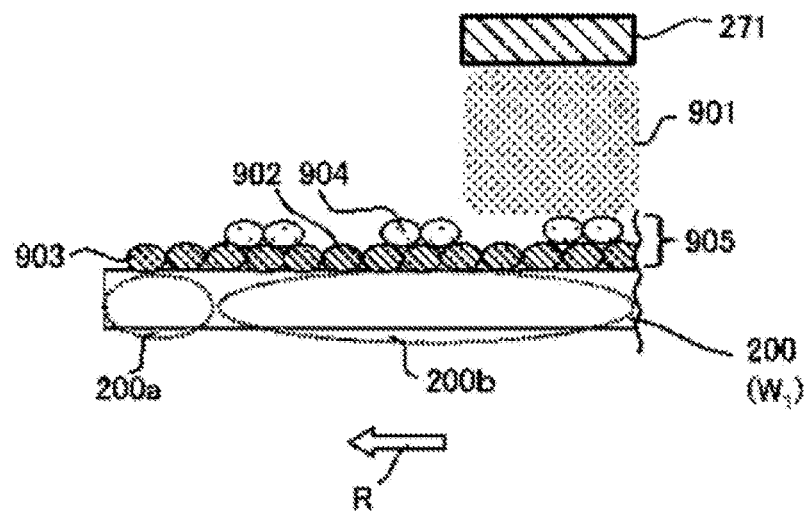
Figure 9E:
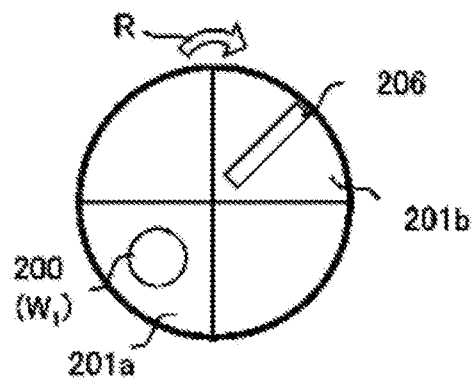
Figure 9F:
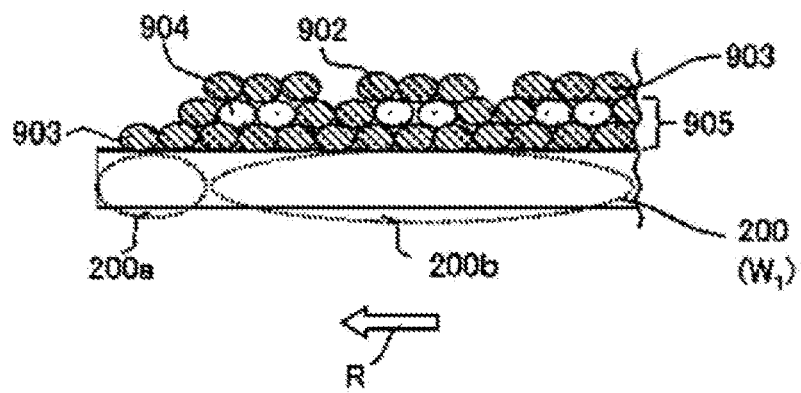
Figure 10A:
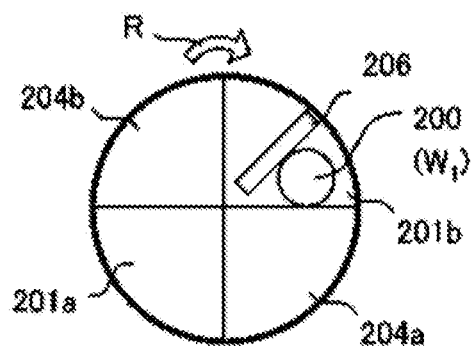
FIGS. 10A, 10C and 10E are schematic plan views illustrating wafer positions at a thin film forming step according to the first embodiment of the present disclosure.
Figure 10B:
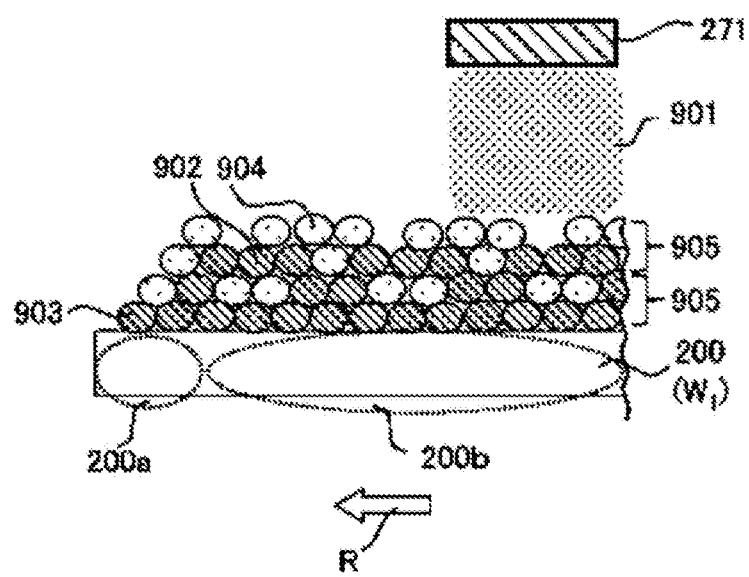
FIGS. 10B, 10D and 10F are schematic sectional views illustrating formation states of a thin film on a wafer in the case of FIGS. 10A, 10C and 10E.
Figure 10C:
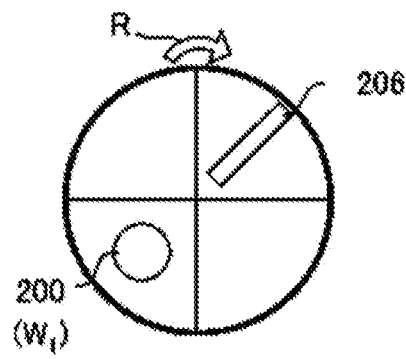
Figure 10D:
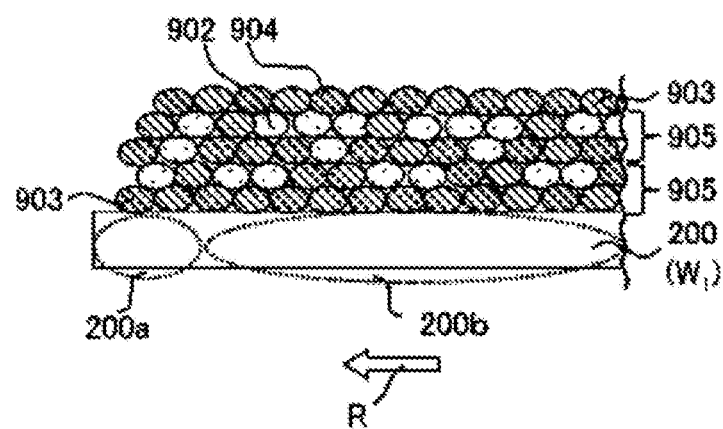
Figure 10E:
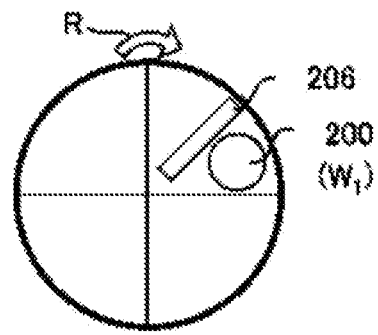
Figure 10F:
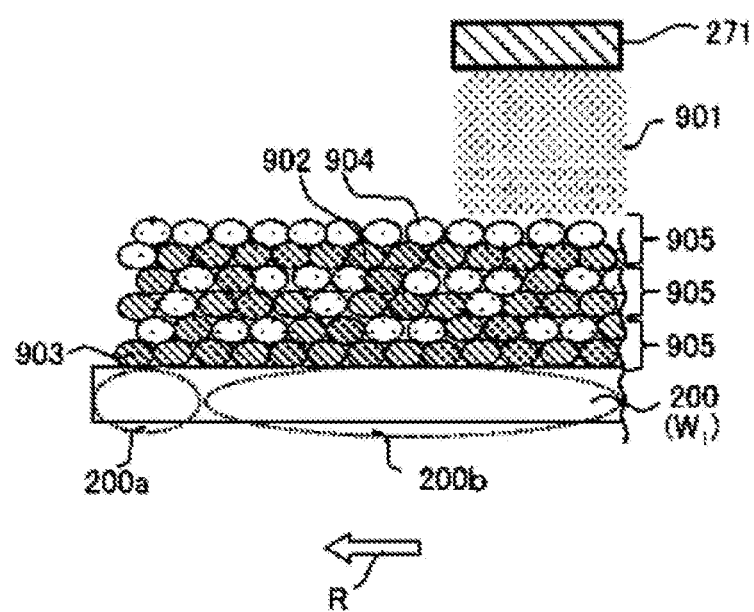

Details of the thin film forming process S104 according to the present embodiment will now be described with reference to FIGS. 8 and 9A to 10F. FIG. 8 is a view illustrating operation timings of respective units in a substrate processing sequence according to the present embodiment. FIGS. 9A, 9C and 9E are schematic plan views illustrating wafer positions in a thin film forming process according to the present embodiment. FIGS. 9B, 9D and 9F are schematic sectional views illustrating formation states of a thin film on a wafer in each case of FIGS. 9A, 9C and 9E. FIGS. 10A, 10C and 10E are schematic plan views illustrating wafer positions in a thin film forming process according to the present embodiment. FIGS. 10B, 10D and 10F are schematic sectional views illustrating formation states of a thin film on a wafer in each case of FIGS. 10A, 10C and 10E.

As illustrated in FIG. 9B, with the gas supply start S204, for example, a silicon-containing layer 903 is formed on the wafer 200 as BTBAS molecules or the like make contact with the wafer 200. In the present embodiment, it is assumed that the silicon-containing layer 903 is configured by, e.g., silicon components 902.

Next, as illustrated in FIGS. 9C and 9D, in the first process S206, the plasma generating unit 206 starts to generate plasma of an oxygen gas in the second processing region 201b (the plasma generating unit illustrated in FIG. 8 is turned on). A plasma sheath 901 including active species of an oxygen element is generated under the plasma generating unit 206.

When the plasma is ignited by the plasma generating unit 206, a wafer 200 (first wafer $W_1$) may be passing a region just below the plasma generating unit 206.

In the present embodiment, for example, the plasma density in the second processing region 201b (the gas activity (first activity) in the second processing region 201b) during the first process S206 is set to be lower than the plasma density (second activity) in the second processing region 201b during the second process S208 as described below.

Specifically, as illustrated in FIG. 8, for example, the pressure in the second processing region 201b during the first process S206 is set to be lower than the pressure (pressure $P_2$) in the second processing region 201b during the second process S208. At least, the pressure (pressure $P_1$) in the second processing region 201b when starting the power supply to the plasma generating unit 206 is set to be lower than the pressure (pressure $P_2$) in the second processing region 201b during the second process S208. Furthermore, the pressure in the second processing region 201b over the entire period of the first process S206 may be set to be lower than the pressure (pressure $P_2$) in the second processing region 201b during the second process S208.

Thus, when the plasma is ignited at the first process, the plasma is in a sparse state. Accordingly, even when the plasma is ignited by the plasma generating unit 206 in a state in which the first wafer $W_1$ is positioned just below the plasma generating unit 206, the density of active species including an oxygen element, which make contact with the surface of the first wafer $W_1$, is reduced.

As illustrated in FIG. 9D, in a non-plasma-irradiated area 200a of the plane of the first wafer $W_1$, the surface of the silicon-containing layer 903 remains unchanged in an exposed state. On the other hand, activated oxygen components adhere to a plasma-irradiated area 200b of the plane of the first wafer $W_1$ in a dispersed state, whereby a modified layer 905 is formed.

In this case, the modified layer 905 is formed with a predetermined low surface roughness such that, when macroscopically viewed, the non-plasma-irradiated area 200a and the plasma-irradiated area 200b occurred when the plasma is ignited are undistinguishable. In other words, in the present embodiment, a clear step difference is hardly generated between the non-plasma-irradiated area 200a and the plasma-irradiated area 200b.

In the present embodiment, for example, during the first process S206, the pressure in the second processing region 201b is set at a low pressure at which the oxygen gas is diffused within the second processing region 201b. For example, during the first process S206, when the power supply to the plasma generating unit 206 is started, the pressure in the second processing region 201b is set at a low pressure at which the oxygen gas is diffused within the second processing region 201b.

The "low pressure at which the oxygen gas is diffused within the second processing region 201b" during the first process S206 refers to, e.g., the following pressure range.

For example, at the first process S206, the pressure in the second processing region 201b is set to be equal to or higher than a pressure at which the plasma of the oxygen gas can be generated by the power supply to the plasma generating unit 206.

More specifically, for example, the pressure in the second processing region 201b is set to fall within a pressure range that allows the modified layer 905 within the plane of the wafer 200 to have an abundance ratio to make a step difference unremarkable.

For example, with respect to the lower and upper limits of the pressure in the second processing region 201b, the pressure in the second processing region 201b may be set to be a pressure at which the plasma density becomes from $5.0 \times 10^8/cm^3$ to $20.0 \times 10^8/cm^3$.

Specifically, the pressure in the second processing region 201b may be set to fall in a range, for example, from 1 Pa to 2,000 Pa, and preferably in some embodiments a range from 10 Pa to 1,000 Pa. Thus, when the plasma is ignited, the density of active species including an oxygen element is stably reduced. In other words, within the plane of the wafer 200, contact probability of active species including an oxygen element is reduced.

As illustrated in FIG. 9D, since the pressure in the second processing region 201b is set to be the aforementioned low pressure at the first process S206, for example, only the smaller number of oxygen components 904 than the silicon components 902 are coupled on or within the silicon-containing layer 903 in the second processing region 201b. For example, an area of the surface of the silicon-containing layer 903 that is exposed without the modified layer 905 formed thereon is wider than an area of the surface of the silicon-containing layer 903 on which the modified layer 905 is formed. In the plasma-irradiated area 200b of the plane of the first wafer $W_1$, the oxygen components 904 existing in the modified layer 905 may be sparsely dispersed at a low density.

As such, a surface of the plasma-irradiated area 200b is not substantially different from a stage of the surface of the non-plasma-irradiated area 200a so that a clear step difference is not generated between the plasma-irradiated area 200b and the non-plasma-irradiated area 200a.

In the present embodiment, as illustrated in FIG. 8, during the first process S206, after stating the generation of plasma by the plasma generating unit 206, the pressure in the second processing region 201b is gradually increased. For example, the pressure in the second processing region 201b is monotonously increased after the generation of plasma is started by the plasma generating unit 206. For example, the pressure in the second processing region 201b is increased from a pressure $P_1$ to a pressure $P_2$ that is higher than the pressure $P_1$. The deposition rate of a thin film on the wafer 200 is gradually increased. Thus, as more silicon-containing layers 903 are modified so that more modified layers 905 are gradually deposited on the wafer 200, a formation density of each of the modified layers 905 within the plane of the wafer 200 may be gradually increased.

Specifically, at the first process S206, the pressure in the second processing region 201b is gradually increased after starting the generation of plasma by the plasma generating unit 206 so that more modified layers 905 are gradually deposited on the wafer 200, for example, in the following manner.

As illustrated in FIGS. 9E and 9F, when the first wafer $W_1$ having the plasma-irradiated area 200b, on which the modified layer 905 with the oxygen components 904 sparsely dispersed is formed, passes through the first processing region 201a, a BTBAS gas is supplied so that a silicon-containing layer 903 is further formed on at least the modified layer 905.

Next, as illustrated in FIGS. 10A and 10B, while the first wafer $W_1$ passes through the second processing region 201b, the plasma of the oxygen gas is irradiated on the first wafer $W_1$ so that a modified layer 905 is further formed on the silicon-containing layer 903.

At this time, since the pressure in the second processing region 201b is gradually increased, the modified layer 905 with the oxygen components 904 densely dispersed is formed on the silicon-containing layer 903. That is to say, the area where the modified layer 905 is formed is disorderly widened.

As more and more modified layers 905 are gradually deposited on the wafer 200 in this way, it is possible to increase the density of the oxygen components 904 or the like in the modified layers 905 within the plane of the wafer 200.

Thus, the silicon-containing layers 903 and the modified layers 905 are disorderly and alternately deposited so that the non-plasma-irradiated area 200a and the plasma-irradiated area 200b occurred when the plasma is ignited become gradually undistinguishable.

As illustrated in FIG. 8, in the present embodiment, for example, the internal pressure of the processing chamber 201 is increased from the pressure $P_1$ to the pressure $P_2$ during the first process S206 and then, is maintained at the pressure $P_2$ during the second process S208.

Thereafter, as illustrated in FIGS. 10C to 10F, the second process S208 is performed to deposit more modified layers 905 on the wafer 200.

As described above, in the present embodiment, the silicon oxide film having a uniform in-plane thickness is formed with a predetermined low surface roughness such that, when macroscopically viewed, the non-plasma-irradiated area 200a and the plasma-irradiated area 200b occurred when the plasma is ignited are undistinguishable.

(As for Third Process S210)

Next, during the third process S210, the wafer 200 passing the region just below the plasma generating unit 206 when the power supply to the plasma generating unit 206 is stopped so that the active species or the like existing in the plasma are getting deactivated will be described in detail in comparison with a comparative example. At the third process S210, a phenomenon opposite to that of the first process S206 may be generated in the following manner.

In a comparative example, it is assumed that the pressure of the second processing region is equally set at the second process and at the third process.

In the comparative example, at the third process, for example, it may be difficult to adjust a timing when the wafer passes through the second processing region due to the high rotation speed of the susceptor. In addition, it may be changed when the plasma is completely extinguished. Thus, the wafer may be passing the region just below the plasma generating unit while the plasma density is largely attenuated. In the following descriptions, among a plurality of wafers, the last wafer passing the region just below the plasma generating unit when the plasma generated by the plasma generating unit is extinguished will be referred to as a "final wafer".

On an area of the plane of the final wafer that has already passed the region just below the plasma generating unit when the plasma is being extinguished, the plasma has been densely irradiated. On the other hand, as the wafer is moved along the rotation direction R of the susceptor, the plasma is not irradiated on the area that has not yet passed the region just below the plasma generating unit when the plasma is being extinguished. For that reason, after the entire final wafer has passed through the second processing region, both the area irradiated with plasma (a plasma-irradiated area) and the area not irradiated with plasma (a non-plasma-irradiated area) are generated within the plane of the final wafer. In the meantime, the plasma is not irradiated on the wafers that pass the region just below the plasma generating unit following the final wafer.

Due to the generation of the non-plasma-irradiated area within the plane of the final wafer when the plasma is extinguished, a film thickness difference may be generated between the non-plasma-irradiated area and the plasma-irradiated area within the plane of the final wafer. Furthermore, a film thickness difference may be generated between the final wafer and the wafers other than the final wafer. In this way, at the third process S210, there may be generated the phenomenon opposite to that of the first process S206.

Accordingly, in the present embodiment, for example, during a time period from the end of the second process S208 to when the plasma of the oxygen gas is extinguished, the pressure in the second processing region 201b is set to be lower than the pressure in the second processing region 201b at the second process S208.

The "time period from the end of the second process S208 to when the plasma of the oxygen gas is extinguished" refers to, for example, a time period from a time when the power supply to the plasma generating unit 206 is stopped after the end of the second process S208 to a time when the plasma of the oxygen gas is completely extinguished. Furthermore, the "time period from the end of the second process S208 to when the plasma of the oxygen gas is extinguished" may include a time period from a certain time when the power supply to the plasma generating unit 206 continues after the end of the second process S208 to a time when the plasma of the oxygen gas is completely extinguished.

Specifically, as illustrated in FIG. 8, for example, at the third process S210, the pressure in the second processing region 201b at one timing during the time period from a time when the power supply to the plasma generating unit 206 is stopped to a time when the plasma of the oxygen gas is extinguished is set to be lower than the pressure (pressure $P_2$) in the second processing region 201b at the second process S208. Alternatively, at the third process S210, the pressure in the second processing region 201b at least when the plasma is extinguished is set to be lower than the pressure (pressure $P_2$) in the second processing region 201b at the second process S208. Furthermore, the pressure in the second processing region 201b over the entire time period at the third process S210 may be set to be lower than the pressure (pressure $P_2$) in the second processing region 201b at the second process S208.

During the time period from the time when the power supply to the plasma generating unit 206 is stopped to the time when the plasma is completely extinguished, the density of active species including oxygen, which make contact with the surface of the wafer 200, is reduced. Thus, during the time period from the time when the power supply to the plasma generating unit 206 is stopped to the time when the plasma is completely extinguished, the modified layer 905 is formed on the wafer 200 in a sparsely dispersed state.

In this case, the modified layer 905 is formed with a predetermined low surface roughness such that, when macroscopically viewed, the non-plasma-irradiated area 200a and the plasma-irradiated area 200b occurred when the plasma is completely extinguished are undistinguishable. In other words, in the present embodiment, a clear step difference is hardly generated between the non-plasma-irradiated area and the plasma-irradiated area.

In the present embodiment, as illustrated in FIG. 8, during the third process S210, the pressure in the second processing region 201b is gradually reduced after the power supply to the plasma generating unit 206 is stopped. For example, the pressure in the second processing region 201b is monotonously reduced after the power supply to the plasma generating unit 206 is stopped. For example, the pressure in the second processing region 201b is reduced from a pressure $P_2$ to a pressure $P_1$. The deposition rate of a thin film on the wafer 200 is gradually reduced. Thus, during the time period from the stop of the power supply to the plasma generating unit 206 to the complete extinguishment of the plasma, the density of the oxygen components 904 or the like in the modified layer 905 within the plane of the wafer 200 may be gradually reduced.

In the present embodiment, at the third process S210, the pressure in the second processing region 201b is set at a low pressure at which the oxygen gas is diffused within the second processing region 201b. For example, the pressure in the second processing region 201b when the plasma is extinguished at the third process S210 is set at a low pressure at which the oxygen gas is diffused within the second processing region 201b.

The "low pressure at which the oxygen gas is diffused within the second processing region 201b" at the third process S210 refers to, e.g., the following pressure range.

For example, at the third process S210, the pressure in the second processing region 201b is set to be equal or higher than a pressure which does not cause the plasma to be extinguished.

More specifically, for example, the pressure in the second processing region 201b is set to fall within a pressure range that allows the modified layer 905 within the plane of the wafer 200 to have an abundance ratio to make a step difference unremarkable.

For example, with respect to the lower and upper limits of the pressure in the second processing region 201b, the pressure in the second processing region 201b may be set to be a pressure at which the plasma density becomes from $5.0 \times 10^8/cm^3$ to $20.0 \times 10^8/cm^3$.

Specifically, the pressure in the second processing region 201b is set to fall in a range, for example, from 1 Pa to 2,000 Pa, and preferably in some embodiments from 10 Pa to 1,000 Pa. Thus, during the time period from the stop of the power supply to the plasma generating unit 206 to the complete extinguishment of the plasma, it is possible to form the modified layer 905 at a low density in a sparsely-dispersed state.

As described above, the silicon oxide film having a uniform in-plane thickness is formed such that, when macroscopically viewed, the non-plasma-irradiated area and the plasma-irradiated area occurred when the plasma is extinguished are undistinguishable.

(5) Effects According to the Present Embodiment

According to the present embodiment, one or more of the following effects are achieved.

(a) According to the present embodiment, the pressure in the second processing region at the first process S206 is set to be lower than the pressure in the second processing region at the second process S208.

Thus, at the first process S206, the density of active species including a second element, which make contact with the first wafer $W_1$, is reduced. At the first process S206, the modified layer 905 is formed in a sparsely-dispersed state in the plasma-irradiated area 200b within the plane of the first wafer $W_1$.

As a result, the silicon oxide film having a uniform in-plane thickness is formed with a predetermined low surface roughness such that, when macroscopically viewed, the non-plasma-irradiated area 200a and the plasma-irradiated area 200b occurred when the plasma is ignited are undistinguishable. Accordingly, it is possible to achieve a uniform film thickness within the plane of a single wafer 200 or between the wafers 200 mounted on the susceptor 217.

(b) According to the present embodiment, at the first process S206, the pressure in the second processing region 201b is set at a low pressure at which the oxygen gas is diffused within the second processing region 201b. Thus, when the plasma is ignited, the density of active species including an oxygen element is stably reduced. Only the smaller number of the oxygen components 904 than the silicon components 902 are coupled on the silicon-containing layer 903 of the first wafer $W_1$. Thus, in the plasma-irradiated area 200b within the plane of the first wafer $W_1$, it is possible to form the modified layer 905 at a low density in a sparsely-dispersed state.

(c) According to the present embodiment, at the first process S206, the pressure in the second processing region 201b is gradually increased after the generation of plasma is started by the plasma generating unit 206. Thus, as more modified layers 905 are gradually deposited on the wafer 200, a density of the oxygen components 904 or the like in the modified layers 905 within the plane of the wafer 200 may be gradually increased. The modified layers 905 are disorderly and alternately deposited so that the non-plasma-irradiated area 200a and the plasma-irradiated area 200b occurred when the plasma is ignited become gradually undistinguishable.

(d) According to the present embodiment, at the third process S210, the pressure in the second processing region 201b during the time period from the end of the second process S208 to the extinguishment of the plasma of the second-element-containing gas is set to be lower than the pressure in the second processing region 201b at the second process S208.

Thus, during the time period from the stop of the power supply to the plasma generating unit 206 to the complete deactivation of the plasma, it is possible to reduce the density of active species including an oxygen element, which make contact with the surface of the wafer 200. Consequently, during the time period from the stop of the power supply to the plasma generating unit 206 to the complete extinguishment of the plasma, the modified layer 905 is formed in a sparsely-dispersed state on the wafer 200.

As a result, the thin film having a uniform in-plane thickness is formed with a predetermined low surface roughness such that, when macroscopically viewed, the non-plasma-irradiated area and the plasma-irradiated area occurred when the plasma is extinguished are undistinguishable.

(6) Method of Manufacturing Semiconductor Device to which the Present Embodiment is Effectively Applicable Next, as one example of a method of manufacturing a semiconductor device, one process of manufacturing a large scale integration (LSI) will be described.

A method of forming a photoresist pattern having a narrow pitch on a wafer 400, namely a so-called "double patterning method", will now be described with reference to FIGS. 11A to 11F. FIGS. 11A to 11F are sectional views of a wafer 400 in a substrate processing process using the double patterning method. The present embodiment is particularly effective in the substrate processing process using a double patterning method.

(First Photoresist Pattern Forming Step)

For example, a silicon oxide film 600, which is to be subjected to a fine processing, is formed on the wafer 400. A hard mask layer 601 is formed on the silicon oxide film 600.

Figure 11A:
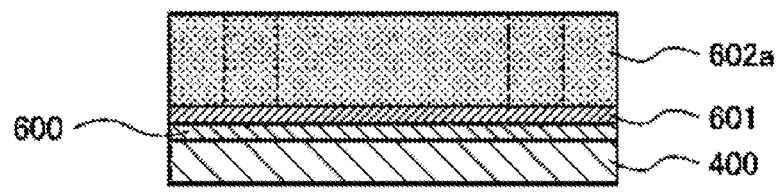
FIGS. 11A to 11F are sectional views of a wafer in a substrate processing process using a double patterning method.

First, as illustrated in FIG. 11A, a first photoresist film 602a is coated on the hard mask layer 601. Then, the wafer 400 is baked.

Figure 11B:
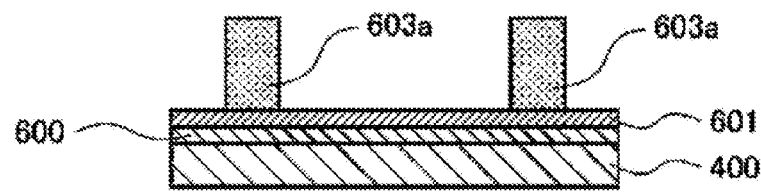

Next, as illustrated in FIG. 11B, by using an ArF excimer light source (193 nm) or a KrF excimer light source (248 nm) with a mask pattern or the like, the wafer 400 is selectively exposed and developed. Thus, a first photoresist pattern 603a is formed.

(Protective Film Forming Process)

Figure 11C:
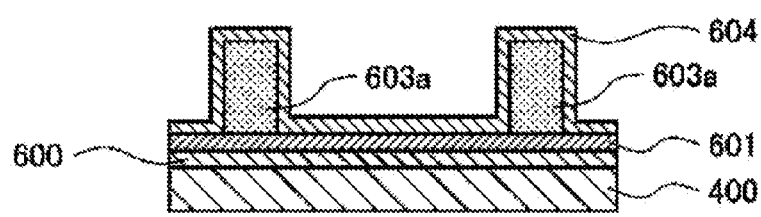

As illustrated in FIG. 11C, a silicon oxide film 604 as a protective film is formed on the first photoresist pattern 603a and the hard mask layer 601 using the substrate processing apparatus 10. The silicon oxide film 604 is also called a sacrificial oxide film. Thus, when forming a second photoresist film 602b to be described later, it is possible to protect the first photoresist pattern 603a and to suppress deformation of the first photoresist pattern 603a.

At this time, in order to form the silicon oxide film 604 on the first photoresist pattern 603a which is an organic substance, substrate processing at a low temperature is performed so that the first photoresist pattern 603a is not thermally denatured. In the present embodiment, it is possible to perform the substrate processing at a low temperature of, e.g., 200 degrees C. or less. Accordingly, the method performed using the substrate processing apparatus 10 according to the present embodiment is particularly effective.

(Second Photoresist Pattern Forming Process)

Figure 11D:
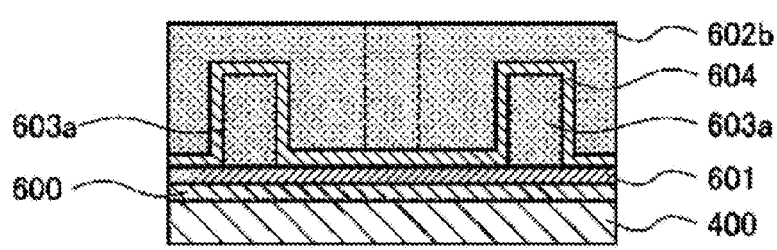

Next, as illustrated in FIG. 11D, a second photoresist film 602b is coated on the silicon oxide film 604. Then, the wafer 400 is baked.

Figure 11E:
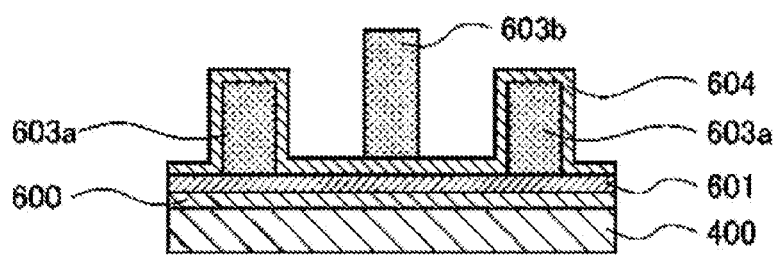

Subsequently, as illustrated in FIG. 11E, by using an ArF excimer light source (193 nm) or a KrF excimer light source (248 nm) with a mask pattern, the wafer 400 is selectively exposed and developed. Thus, a second photoresist pattern 603b is formed on the silicon oxide film 604 in a position that is different from the positions where the first photoresist pattern 603a is formed. For example, the second photoresist pattern 603b is formed at the center between the two first photoresist patterns 603a adjacent to each other.

Figure 11F:
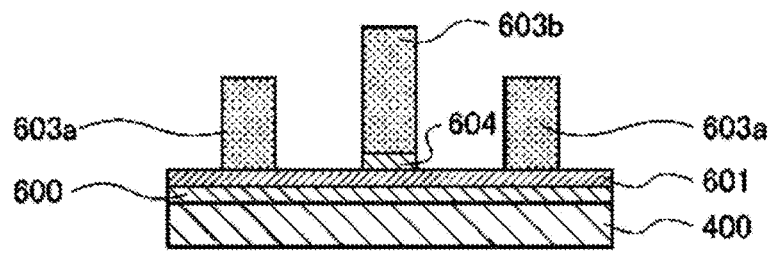

Next, as illustrated in FIG. 11F, the silicon oxide film 604 that covers the first photoresist pattern 603a and the hard mask layer 601 is etched out.

In this way, by performing a patterning of a photoresist pattern multiple times using the protective film (by performing a double patterning method), it is possible to obtain the first photoresist patterns 603a and the second photoresist pattern 603b that are finer than the photoresist patterns obtained by a single patterning method.

Next, the hard mask layer 601 is etched using the first photoresist patterns 603a and the second photoresist pattern 603b as masks, thereby forming hard mask patterns. Then, the silicon oxide film 600, which is to be subjected to a fine processing, is etched using the hard mask layer 601 as a mask. At this time, the first photoresist patterns 603a and the second photoresist pattern 603b may be removed or may be left. In the aforementioned manner, for example, grooves are formed in the silicon oxide film 600. Furthermore, wiring patterns are embedded in the grooves of the silicon oxide film 600.

(Relationship with the Present Embodiment)

In this regard, for example, a width of each groove formed in the silicon oxide film 600 and a distance between the grooves are required to be set substantially as designed. In this case, the film thickness distribution of the silicon oxide film 604 as a protective film is important.

For example, if a film thickness difference of the silicon oxide film 604 is generated within the plane of a single wafer 400 or if a film thickness difference of the silicon oxide film 604 is generated between wafers 400, there is a possibility that the following adverse effects may occur. For example, when the silicon oxide film 604 is etched under a predetermined etching condition, the small-thickness portion of the silicon oxide film 604 may be over-etched. Thus, in the first photoresist patterns 603a and the second photoresist pattern 603b in the vicinity of the small-thickness portion of the silicon oxide film 604, or in the silicon oxide film 604 existing immediately below the second photoresist pattern 603b, the pattern width may be reduced. Due to the reduction in the line width of the first photoresist patterns 603a, the second photoresist pattern 603b and the silicon oxide film 604 existing immediately below the second photoresist pattern 603b, if the hard mask layer 601 and the silicon oxide film 600 are etched, the groove width of the silicon oxide film 600 in the vicinity of the small-thickness portion of the silicon oxide film 604 may differ from the groove width of the silicon oxide film 600 in the vicinity of the large-thickness portion of the silicon oxide film 604. Accordingly, when forming the silicon oxide film 604 as a protective film, it would be beneficial to make the thickness of the silicon oxide film 604 uniform.

In the up-to-date fine processing, a wiring line dimension of 20 nm or less is required. Accordingly, even if the film thickness difference of the silicon oxide film 604 as a protective film is about several nanometers, it is still possible that a large ratio of a pattern width difference with respect to the width of a finally-formed wiring line is generated.

As described above, in the case of applying the present embodiment, the surface roughness of the silicon oxide film 604 may become higher than that of the aforementioned comparative example in which the pressure is kept constant from the time of generation of plasma. However, in the double patterning method, a certain degree of surface roughness is permitted. Rather, it is important to keep the film thickness constant.

According to the present embodiment, the silicon oxide film 604 is formed on the wafer 400 at a predetermined surface roughness. In addition, it is possible to restrain a phenomenon in which only the thickness of the silicon oxide film 604 in the non-plasma-irradiated area 200a within the plane of the first wafer $W_1$ becomes smaller than the thickness of the silicon oxide film 604 in the plasma-irradiated area 200b.

That is to say, it is possible to suppress generation of a pattern width difference between the non-plasma-irradiated area 200a and the plasma-irradiated area 200b and between the first wafer $W_1$ and the wafers 400 other than the first wafer $W_1$, for example, when the silicon oxide film 604 is etched under the same etching condition.

The present embodiment is particularly suitable for a process in which the film thickness uniformity is more important than the surface roughness as set forth above.

Second Embodiment of the Present Disclosure

Hereinafter, a second embodiment of the present disclosure will be described. The present embodiment differs from the first embodiment in terms of the method of reducing the plasma density in the second processing region 201b at the first process S206 or the third process S210. In the present embodiment, the aforementioned substrate processing apparatus 10 is used. The configurations other than those described above remain the same as the configurations of the first embodiment.

(1) Substrate Processing Process

Figure 12:
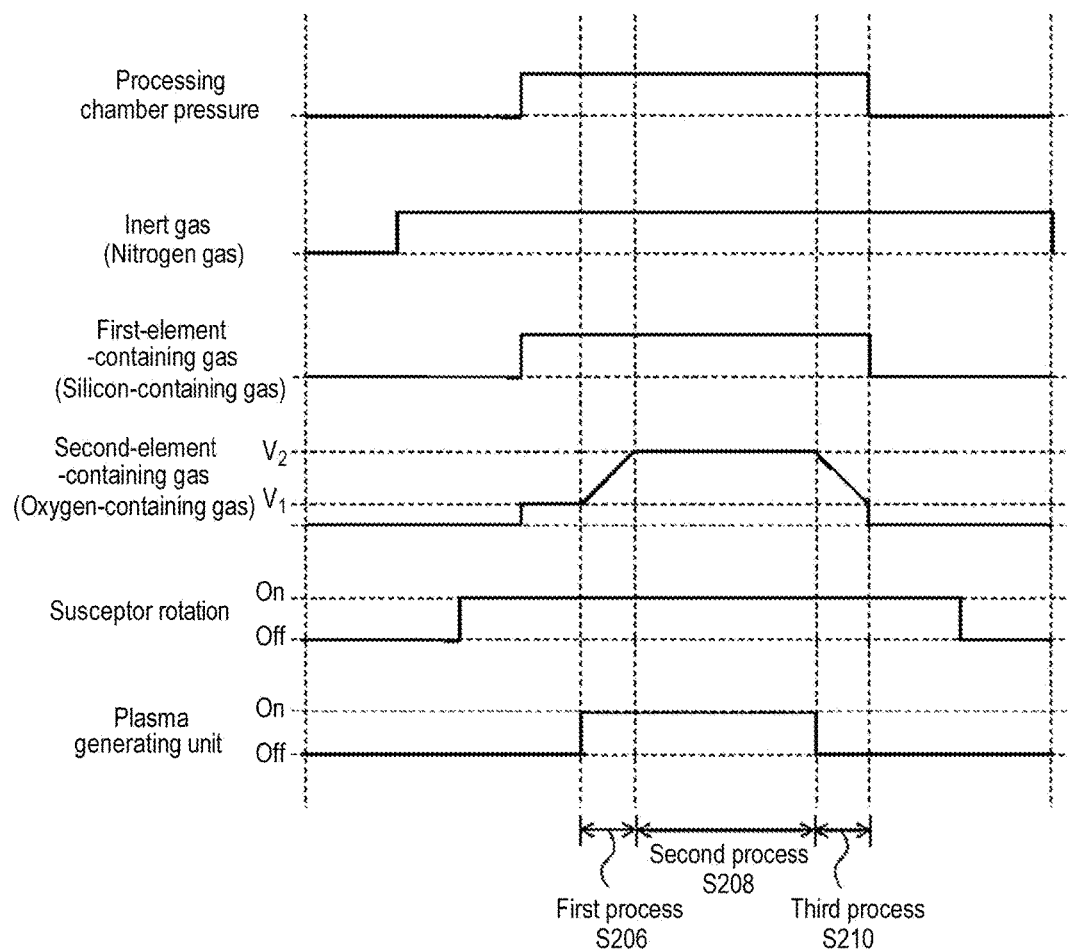
FIG. 12 is a view illustrating timings in a substrate processing sequence according to a second embodiment of the present disclosure.

The substrate processing process according to the present embodiment will be described with reference to FIG. 12. FIG. 12 is a view illustrating timings in a substrate processing sequence according to a second embodiment of the present disclosure. Hereinafter, the process from the gas supply start S204 to the gas supply stop S212 in the present embodiment will be described.

(Gas Supply Start S204)

The valve 232d is opened to start to supply a BTBAS gas as a first-element-containing gas into the first processing region 201a and the valve 233d is opened to supply an oxygen gas as a second-element-containing gas into the second processing region 201b.

At this time, the mass flow controller 232c is controlled to make the flow rate of the BTBAS gas become a predetermined flow rate. For example, the flow rate of the BTBAS gas is kept constant until the third process S210.

Furthermore, the mass flow controller 233c is controlled to make the flow rate of the oxygen gas become a predetermined flow rate. At this time, for example, the flow rate of the oxygen gas at the gas supply start S204 is adjusted to become equal to the flow rate (flow rate $V_1$) of the oxygen gas at the first process S206.

(First Process S206)

Next, if the flow rates of the BTBAS gas and the oxygen gas are stabilized, the plasma generating unit 206 starts to generate plasma (the plasma generating unit is turned on in FIG. 12). Plasma of the oxygen gas is generated immediately below the plasma generating unit 206 in the second processing region 201b.

In the present embodiment, the flow rate (flow rate $V_1$) of the oxygen gas supplied into the second processing region 201b at the first process S206 is set to be lower than the flow rate (flow rate $V_2$) of the oxygen gas supplied into the second processing region 201b at the second process S208. Thus, the plasma density in the second processing region 201b at the first process S206 becomes lower than the plasma density in the second processing region 201b at the second process S208.

In the present embodiment, at the first process S206, the flow rate of the oxygen gas supplied into the second processing region 201b is set at a low flow rate at which the oxygen gas is diffused within the second processing region 201b.

The "low flow rate at which the oxygen gas is diffused within the second processing region 201b" at the first process S206 refers to, for example, the following flow rate range.

For example, at the first process S206, the flow rate of the oxygen gas supplied into the second processing region 201b is set to be equal to or higher than a flow rate at which the plasma of the oxygen gas can be generated by the power supply to the plasma generating unit 206.

More specifically, for example, the flow rate of the oxygen gas supplied into the second processing region 201b is set to fall within a flow rate range that allows the modified layer 905 within the plane of the wafer 200 to have an abundance ratio to make a step difference unremarkable.

For example, with respect to the lower and upper limits of the flow rate of the oxygen gas supplied into the second processing region 201b, the flow rate of the oxygen gas supplied into the second processing region 201b may be set at a flow rate at which the plasma density becomes from $5.0 \times 10^8/cm^3$ to $20.0 \times 10^8/cm^3$.

Specifically, the flow rate of the oxygen gas supplied into the second processing region 201b may be set to fall in a range, for example, from 10 sccm to 5,000 sccm, and preferably in some embodiments from 100 sccm to 1,000 sccm. Thus, when the plasma is ignited, the density of active species including an oxygen element is stably reduced.

In the present embodiment, as illustrated in FIG. 12, the flow rate of the oxygen gas supplied into the second processing region 201b is gradually increased after the plasma generating unit 206 starts to generate plasma. For example, the flow rate of the oxygen gas supplied into the second processing region 201b is monotonously increased after the generation of plasma is started by the plasma generating unit 206. For example, the flow rate of the oxygen gas supplied into the second processing region 201b is increased from a flow rate $V_1$ to a flow rate $V_2$ that is higher than the flow rate $V_1$. Thus, as more modified layers 905 are gradually laminated on the wafer 200, it is possible to increase the density of the oxygen components 904 or the like in the modified layers 905 within the plane of the wafer 200.

(Second Process S208)

Next, subsequent to the first process S206, the plasma is continuously generated by the plasma generating unit 206 and a second process S208 is performed to form a silicon oxide film containing a silicon element and an oxygen element on each of the wafers 200. At the second process S208, for example, the flow rate of the oxygen gas supplied into the second processing region 201b is kept constant at the flow rate $V_2$. At the second process S208, the susceptor 217 is rotated so that the wafers 200 sequentially pass through the first processing region 201a, the first purge region 204a, the second processing region 201b and the second purge region 204b.

(Third Process S210)

Next, after the second process S208, the power supply to the plasma generating unit 206 is stopped (the plasma generating unit is turned off in FIG. 12). Even after the power supply to the plasma generating unit 206 is stopped, the supply of the BTBAS gas to the first processing region 201a, the supply of the oxygen gas to the second processing region 201b, the supply of the inert gas to the first purge region 204a and the second purge region 204b, as well as the rotation of the susceptor 217 are continuously performed for a predetermined time period.

In the present embodiment, for example, the flow rate of the oxygen gas supplied into the second processing region 201b during a time period from the end of the second process S208 to the extinguishment of the plasma is set to be lower than the flow rate of the oxygen gas supplied into the second processing region 201b at the second process S208.

Furthermore, in the present embodiment, as illustrated in FIG. 12, at the third process S210, the flow rate of the oxygen gas supplied into the second processing region 201b is gradually reduced after the power supply to the plasma generating unit 206 is stopped. For example, the flow rate of the oxygen gas supplied into the second processing region 201b is monotonously reduced after the power supply to the plasma generating unit 206 is stopped. For example, the flow rate of the oxygen gas supplied into the second processing region 201b is reduced from the flow rate $V_2$ to the flow rate $V_1$. Thus, during the time period from the stop of the power supply to the plasma generating unit 206 to the complete extinguishment of the plasma, it is possible to gradually reduce the density of the oxygen components 904 in the modified layer 905 within the plane of the wafer 200.

Moreover, in the present embodiment, at the third process S210, the flow rate of the oxygen gas supplied into the second processing region 201b is set at a low flow rate at which the oxygen gas is diffused within the second processing region 201b.

For example, at the third process S210, the flow rate of the oxygen gas supplied into the second processing region 201b is set to be equal to or higher than a flow rate at which the reduction of the flow rate does not cause the plasma to be extinguished.

More specifically, for example, the flow rate of the oxygen gas supplied into the second processing region 201b is set to fall within a flow rate range that allows the modified layer 905 within the plane of the wafer 200 to have an abundance ratio to make a step difference unremarkable.

For example, with respect to the lower and upper limits of the flow rate of the oxygen gas supplied into the second processing region 201b, the flow rate of the oxygen gas supplied into the second processing region 201b may be set at a flow rate at which the plasma density becomes from $5.0 \times 10^8/cm^3$ to $20.0 \times 10^8/cm^3$.

Specifically, the flow rate of the oxygen gas supplied into the second processing region 201b is set to fall in a range, for example, from 10 sccm to 5,000 sccm, and preferably in some embodiments from 100 sccm to 1,000 sccm. Thus, during the time period from the stop of the power supply to the plasma generating unit 206 to the complete extinguishment of the plasma, it is possible to form the modified layer 905 at a low density in a sparsely-dispersed state.

(Gas Supply Stop S212)

After the third process S210, at least the valves 232d and 233d are closed to stop the supply of the BTBAS gas and the oxygen gas into the first processing region 201a and the second processing region 201b. The subsequent processes are the same as those of the first embodiment.

(2) Effects According to the Present Embodiment

According to the present embodiment, one or more of the following effects are achieved.

(a) According to the present embodiment, the flow rate of the second-element-containing gas supplied into the second processing region 201b at the first process S206 is set to be lower than the flow rate of the second-element-containing gas supplied into the second processing region 201b at the second process S208. Thus, the plasma density in the second processing region 201b at the first process S206 becomes lower than the plasma density in the second processing region 201b at the second process S208. By virtue of the same effects as those of the first embodiment, the thin film having a uniform in-plane thickness is formed with a predetermined low surface roughness such that, when macroscopically viewed, the non-plasma-irradiated area 200a and the plasma-irradiated area 200b occurred when the plasma is ignited are undistinguishable.

(b) According to the present embodiment, at the third process S210, the flow rate of the second-element-containing gas supplied into the second processing region 201b during the time period from the end of the second process S208 to the extinguishment of the plasma of the second-element-containing gas is set to be lower than the flow rate of the second-element-containing gas supplied into the second processing region 201b at the second process S208. By virtue of the same effects as those of the first embodiment, the thin film having a uniform in-plane thickness is formed with a predetermined low surface roughness such that, when macroscopically viewed, the non-plasma-irradiated area and the plasma-irradiated area occurred when the plasma is extinguished are undistinguishable.

Other Embodiments of the Present Disclosure

While some embodiments of the present disclosure have been specifically described hereinabove, the present disclosure is not limited to the aforementioned embodiments but may be differently modified without departing from the spirit of the present disclosure.

In the aforementioned embodiments, there has been described a case where the reaction container 203 is divided into four regions. However, the present disclosure is not limited thereto. The number and arrangement of the processing regions may be determined depending on the kind of the corresponding substrate or the kind of the film as formed.

Furthermore, in the aforementioned embodiments, there has been described a case where the angle between the respective partition plates 205 is 90 degrees. However, the present disclosure is not limited thereto. In view of the supply times of different gases to the wafer 200 (the processing time of the wafer 200), for example, the angle between the two partition plates 205 that defines the second processing region 201b may be made larger, thereby prolonging the time (processing time) required for the wafer 200 to pass through the second processing region 201b. In this way, the angle between the respective partition plates 205 may be appropriately changed.

Furthermore, in the aforementioned embodiments, there has been described a case where the respective processing regions are partitioned by the partition plates 205. However, the present disclosure is not limited thereto. It is only necessary that the processing chamber 201 be configured so as not to mix the processing gases supplied to the respective processing regions 201a and 201b.

Furthermore, in the aforementioned embodiments, there has been described a case where gaps are formed between the end portions of the partition plates 205 and the sidewall of the reaction container 203 and where the internal pressure of the processing chamber 201 is equal in the respective regions. However, the present disclosure is not limited thereto. The first processing region 201a, the first purge region 204a, the second processing region 201b and the second purge region 204b may be air-tightly divided. In other words, the pressures in the respective regions may differ from one another.

Furthermore, in the aforementioned embodiments, there has been described a case where five wafers 200 are processed in one process chamber 202. However, the present disclosure is not limited thereto. One wafer 200 may be processed in one process chamber 202. Alternatively, more than five wafers 200 may be processed in one process chamber 202.

Furthermore, in the aforementioned embodiments, there has been described a case where the pre-chamber 122 or the pre-chamber 123 is configured to have both a function of loading the wafer 200 and a function of unloading the wafer 200. However, the present disclosure is not limited thereto. One of the pre-chamber 122 and the pre-chamber 123 may be used for an unloading purpose and the other may be used for a loading purpose. By using the pre-chamber 122 or the pre-chamber 123 exclusively for a loading purpose or an unloading purpose, it is possible to reduce cross-contamination. By using the pre-chamber 122 or the pre-chamber 123 for a loading purpose and an unloading purpose, it is possible to improve the transfer efficiency.

Furthermore, in the aforementioned embodiments, there has been described the substrate processing performed only in one process chamber 202. However, the present disclosure is not limited thereto. Substrate processing may be performed in parallel in different process chambers.

Furthermore, in the aforementioned embodiments, there has been described a case where the four process chambers 202 are identically configured. However, the present disclosure is not limited thereto. The respective process chambers may have different configurations from each other so that different processes may be performed in the respective process chambers. For example, when different processes are respectively performed in a first process chamber and a second process chamber, a predetermined process may be performed to the wafer 200 in the first process chamber and then a different process from the process performed in the first process chamber may be performed to the wafer 200 in the second process chamber. Furthermore, when a predetermined process is performed in the first process chamber and then a different process from the predetermined process is performed in the second process chamber, the wafer may go through a pre-chamber.

Furthermore, in the aforementioned embodiments, there has been described a case where the silicon oxide film is formed on the wafer 200 by using the silicon-containing gas as the first-element-containing gas and using the oxygen-containing gas as the second-element-containing gas. However, the present disclosure is not limited thereto. For example, a hafnium (Hf)-containing gas, a zirconium (Zr)-containing gas or a titanium (Ti)-containing gas may be used as the first-element-containing gas to form a high-k film, such as a hafnium oxide film (HfO film), a zirconium oxide film (ZrO film), a titanium oxide film (TiO film) or the like, on the wafer 200.

Furthermore, in the aforementioned embodiments, there has been described a case where the oxygen-containing gas is used as the second-element-containing gas. However, the present disclosure is not limited thereto. A nitrogen-containing gas may be used as the second-element-containing gas. In this case, a nitrogen ($N_2$) gas or an ammonia ($NH_3$) gas may be used as the nitrogen-containing gas.

Furthermore, in the aforementioned embodiments, there has been described a case where the electrodes 271 of the plasma generating unit 206 have a rod shape. However, the present disclosure is not limited thereto. The electrodes 271 of the plasma generating unit 206 may be alternately-facing electrodes having a comb shape or electrodes having other shapes. In addition, the electrodes 271 of the plasma generating unit 206 may substantially cover the entire second processing region 201b.

Furthermore, in the aforementioned embodiments, there has been described a case where the second-element-containing gas is supplied into the second processing region 201b and where the plasma is generated in the second processing region 201b by the plasma generating unit 206. However, the present disclosure is not limited thereto. A remote plasma method for generating plasma outside the reaction container may be used. Alternatively, ozone having a high energy level may be used.

Furthermore, in the aforementioned embodiments, there has been described a case where the inert gas supply unit 253 is shared by the first purge region 204a and the second purge region 204b. However, inert gas supply units may be individually installed.

Furthermore, in the aforementioned embodiments, there has been described a case where the respective gases are supplied into the processing chamber 201 from the center of the reaction container 203. However, the present disclosure is not limited thereto. For example, a nozzle for supplying the first-element-containing gas may be installed in the first processing region. A nozzle for supplying the second-element-containing gas may be installed in the second processing region. Nozzles for supplying the inert gas may be installed in the first purge region and the second purge region.

Furthermore, in the aforementioned embodiments, there has been described a case where the wafer 200 is moved to the processing position or the transfer position by moving the susceptor 217 up and down by the use of the elevating mechanism 268. However, the present disclosure is not limited thereto. The wafer 200 may be moved to the processing position or the transfer position by moving the wafer pushup pins 266 up and down.

Furthermore, in the aforementioned embodiments, there has been described a case where, at the second process S208, it is determined whether one cycle including the first processing region passing S302, the first purge region passing S304, the second processing region passing S306 and the second purge region passing S308 has been performed a predetermined number of times. However, the present disclosure is not limited thereto. Even at the first process or the third process, it may be determined whether the aforementioned cycle has been performed a predetermined number of times. In addition, at the first process, the second process and the third process, it may be determined whether the aforementioned cycle has been performed a predetermined number of times.

Furthermore, in the aforementioned first embodiment, there has been described a case where the pressure in the second processing region 201b is gradually increased at the first process S206 and where the pressure in the second processing region 201b is kept constant at the second process S208. However, the present disclosure is not limited thereto. That is to say, at least the pressure in the second processing region at the first process is set to be lower than the pressure in the second processing region at the second process. For example, the pressure in the second processing region at the first process may be kept constant at a pressure lower than the pressure in the second processing region at the second process. Alternatively, a time period during which the pressure in the second processing region at the second process is increased to a predetermined pressure higher than the pressure in the second processing region at the first process may be set. Alternatively, the first process and the second process may be combined with each other.

Furthermore, in the aforementioned first embodiment, there has been described a case where, at the first process S206, the pressure in the second processing region 201b is monotonously increased after the generation of plasma is started by the plasma generating unit 206. However, the present disclosure is not limited thereto. At the first process, the pressure in the second processing region may be increased step by step (Stepwise) after the generation of plasma is started by the plasma generating unit.

Furthermore, in the aforementioned first embodiment, there has been described a case where, at the second process S208, the pressure in the second processing region 201b is kept constant and where, at the third process S210, the pressure in the second processing region 201b is gradually reduced after the power supply to the plasma generating unit 206 is stopped. However, the present disclosure is not limited thereto. That is to say, it is only necessary that at least during the time period from the end of the second process to the deactivation of the plasma of the second-element-containing gas, the pressure in the second processing region is lower than the pressure in the second processing region at the second process. For example, a time period during which the pressure in the second processing region at the second process is reduced to a predetermined pressure may be set. The pressure in the second processing region at the third process may be kept constant at a pressure lower than the pressure in the second processing region at the second process. Alternatively, the second process and the third process may be combined with each other.

Furthermore, in the aforementioned first embodiment, there has been described a case where, at the third process S210, the pressure in the second processing region 201b is monotonously reduced after the power supply to the plasma generating unit 206 is stopped. However, the present disclosure is not limited thereto. At the third process, the pressure in the second processing region may be increased step by step (Stepwise) after the power supply to the plasma generating unit is stopped.

Furthermore, in the aforementioned first embodiment, there has been described a case where, at the third process S210, the pressure in the second processing region 201b is gradually reduced after the power supply to the plasma generating unit 206 is stopped. However, the present disclosure is not limited thereto. At the third process, the pressure in the second processing region may start to be gradually reduced even before the power supply to the plasma generating unit is stopped.

Furthermore, the modifications of the "pressure in the second processing region 201b" in the first embodiment as described above may be applied to the "flow rate of the second-element-containing gas supplied into the second processing region 201b" in the second embodiment. Furthermore, at the first process and the second process, both the pressure in the second processing region 201b and the flow rate of the second-element-containing gas supplied into the second processing region 201b may be changed.

Furthermore, in the aforementioned embodiments, there has been described a case where, at the thin film forming process, the flow rate of the first-element-containing gas supplied into the first processing region 201a is kept constant. However, the present disclosure is not limited thereto. At the thin film forming process, the flow rate of the first-element-containing gas supplied into the first processing region may be changed. The flow rate of the first-element-containing gas supplied into the first processing region may be changed together with the flow rate of the second-element-containing gas supplied into the second processing region. For example, similar to the second-element-containing gas, the flow rate of the first-elementcontaining gas supplied into the first processing region at the first process may be set to be lower than the flow rate of the first-element-containing gas supplied into the first processing region at the second process.

<Preferred Aspects of the Present Disclosure>

Hereinafter, some preferred aspects of the present disclosure will be additionally described.

(Supplementary Note 1)

According to one aspect of the present disclosure, there is provided a method of manufacturing a semiconductor device, including:

mounting a plurality of substrates on a substrate mounting table rotatably installed within a processing chamber for processing the substrates, the substrates being mounted along a rotation direction of the substrate mounting table;

starting to supply a first-element-containing gas containing a first element and a second-element-containing gas containing a second element respectively to a first processing region and a second processing region defined within the processing chamber along the rotation direction of the substrate mounting table, while rotating the substrate mounting table and exhausting an interior of the processing chamber;

performing a first processing for starting to generate plasma of the second-element-containing gas in the second processing region by a plasma generating unit, the plasma generating unit being at least partially installed within the second processing region; and performing a second processing for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region, wherein in the first processing, a plasma density in the second processing region is set to be lower than a plasma density in the second processing region in the second processing.

(Supplementary Note 2)

In the method of Supplementary Note 1, wherein in the first processing, a pressure in the second processing region is set to be lower than a pressure in the second processing region in the second processing.

(Supplementary Note 3)

In the method of Supplementary Note 1 or 2, wherein in the first processing, a pressure in the second processing region is set at a pressure at which the second-element-containing gas is diffused within the second processing region.

(Supplementary Note 4)

In the method of any one of Supplementary Notes 1 to 3, wherein in the first processing, a pressure in the second processing region may be set at a pressure at which the plasma density falls within a range from $5.0 \times 10^8/cm^3$ to $20.0 \times 10^8/cm^3$.

(Supplementary Note 5)

In the method of any one of Supplementary Notes 1 to 4, wherein in the first processing, a pressure in the second processing region is gradually increased after starting to generate the plasma.

(Supplementary Note 6)

The method of any one of Supplementary Notes 1 to 5, further including, performing a third processing, wherein in the third processing, a pressure in the second processing region is set to be lower than a pressure in the second processing region in the second processing, during a time period from completion of the second processing to an extinguishment of the plasma of the second-element-containing gas.

(Supplementary Note 7)

According to another aspect of the present disclosure, there is provided a method of manufacturing a semiconductor device, including:

mounting a plurality of substrates on a substrate mounting table rotatably installed within a processing chamber for processing the substrates, the substrates being mounted along a rotation direction of the substrate mounting table;

starting to supply a first-element-containing gas containing a first element and a second-element-containing gas containing a second element respectively to a first processing region and a second processing region defined within the processing chamber along the rotation direction of the substrate mounting table, while rotating the substrate mounting table and exhausting an interior of the processing chamber;

performing a first processing for starting to generate plasma of the second-element-containing gas in the second processing region by a plasma generating unit, the plasma generating unit being at least partially installed within the second processing region;

performing a second processing for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region; and performing a third processing, wherein in the third processing, a pressure in the second processing region is set to be lower than a pressure in the second processing region in the second processing, during a time period from completion of the second processing to an extinguishment of the plasma of the second-element-containing gas.

(Supplementary Note 8)

In the method of Supplementary Note 6 or 7, wherein in the third processing, the pressure in the second processing region is set at a pressure at which the second-element-containing gas is diffused within the second processing region.

(Supplementary Note 9)

In the method of any one of Supplementary Notes 6 to 8, wherein in the third processing, the pressure in the second processing region is set at a pressure at which a plasma density falls within a range from $5.0 \times 10^8/cm^3$ to $20.0 \times 10^8/cm^3$.

(Supplementary Note 10)

In the method of any one of Supplementary Notes 1 to 9, wherein a flow rate of the second-element-containing gas supplied into the second processing region in the first processing is set to be lower than a flow rate of the second-element-containing gas supplied into the second processing region in the second processing.

(Supplementary Note 11)

According to a further aspect of the present disclosure, there is provided a method of manufacturing a semiconductor device, including:

mounting a plurality of substrates on a substrate mounting table rotatably installed within a processing chamber for processing the substrates, the substrates being mounted along a rotation direction of the substrate mounting table;

starting to supply a first-element-containing gas containing a first element and a second-element-containing gas containing a second element respectively to a first processing region and a second processing region defined within the processing chamber along the rotation direction of the substrate mounting table, while rotating the substrate mounting table and exhausting an interior of the processing chamber;

performing a first processing for starting to generate plasma of the second-element-containing gas in the second processing region by a plasma generating unit, the plasma generating unit being at least partially installed within the second processing region; and performing a second processing for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region, wherein in the first processing, a flow rate of the second-element-containing gas supplied into the second processing region is set to be lower than a flow rate of the second-element-containing gas supplied into the second processing region in the second processing.

(Supplementary Note 12)

According to a further aspect of the present disclosure, there is provided a substrate processing apparatus, including:

a processing chamber including a first processing region and a second processing region, wherein substrates are processed in the first processing region and the second processing region;

a substrate mounting table rotatably installed within the processing chamber, the substrates being mounted on the substrate mounting table along a rotation direction of the substrate mounting table;

a rotating mechanism configured to rotate the substrate mounting table to allow the substrates to sequentially pass through the first processing region and the second processing region in turn;

a processing gas supply system configured to supply a first-element-containing gas containing a first element into the first processing region and to supply a second-element-containing gas containing a second element into the second processing region;

an exhaust system configured to exhaust an interior of the processing chamber and to regulate an internal pressure of the processing chamber;

a plasma generating unit at least partially installed within the second processing region and configured to generate plasma of the second-element-containing gas in the second processing region; and a control unit configured to control at least the rotating mechanism, the processing gas supply system, the exhaust system and the plasma generating unit and to perform:

mounting the substrates on the substrate mounting table along the rotation direction of the substrate mounting table;

starting to supply the first-element-containing gas and the second-element-containing gas respectively to the first processing region and the second processing region, while rotating the substrate mounting table and exhausting the interior of the processing chamber;

performing a first process for starting to generate plasma of the second-element-containing gas in the second processing region by the plasma generating unit; and performing a second process for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region, wherein in the first process, a plasma density in the second processing region is set to be lower than a plasma density in the second processing region in the second process.

(Supplementary Note 13)

According to a further aspect of the present disclosure, there is provided a substrate processing apparatus, including:

a processing chamber including a first processing region and a second processing region, wherein substrates are processed in the first processing region and the second processing region;

a substrate mounting table rotatably installed within the processing chamber, the substrates being mounted on the substrate mounting table along a rotation direction of the substrate mounting table;

a rotating mechanism configured to rotate the substrate mounting table to allow the substrates to sequentially pass through the first processing region and the second processing region in turn;

a processing gas supply system configured to supply a first-element-containing gas containing a first element into the first processing region and to supply a second-element-containing gas containing a second element into the second processing region;

an exhaust system configured to exhaust an interior of the processing chamber and to regulate an internal pressure of the processing chamber;

a plasma generating unit at least partially installed within the second processing region and configured to generate plasma of the second-element-containing gas in the second processing region; and a control unit configured to control at least the rotating mechanism, the processing gas supply system, the exhaust system and the plasma generating unit and to perform:

mounting the substrates on the substrate mounting table along the rotation direction of the substrate mounting table;

starting to supply the first-element-containing gas and the second-element-containing gas respectively to the first processing region and the second processing region, while rotating the substrate mounting table and exhausting the interior of the processing chamber;

performing a first process for starting to generate plasma of the second-element-containing gas in the second processing region by the plasma generating unit; and performing a second process for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region, wherein in the first process, a pressure in the second processing region is set to be lower than a pressure in the second processing region in the second process.

(Supplementary Note 14)

According to a further aspect of the present disclosure, there is provided a method of manufacturing a semiconductor device, including:

mounting substrates on a substrate mounting table rotatably installed within a processing chamber for processing the substrates, the substrates being mounted along a rotation direction of the substrate mounting table;

rotating the substrate mounting table;

exhausting an interior of the processing chamber;

supplying a first-element-containing gas containing a first element to a first processing region defined within the processing chamber along the rotation direction of the substrate mounting table;

supplying a second-element-containing gas containing a second element to a second processing region defined within the processing chamber along the rotation direction of the substrate mounting table;

performing a first processing for starting to generate plasma of the second-element-containing gas in the second processing region by a plasma generating unit installed at least in a portion within the second processing region; and performing a second processing for forming a thin film containing the first element and the second element on each of the substrates by rotating the substrate mounting table to cause the substrates to sequentially pass through the first processing region and the second processing region a predetermined number of times in turn so that a first-element-containing layer containing the first element is formed on each of the substrates when each of the substrates passes through the first processing region, and the first-element-containing layer is modified with the plasma of the second-element-containing gas when each of the substrates passes through the second processing region, wherein in the first processing, a plasma density in the second processing region is set to be lower than a plasma density in the second processing region in the second processing.

(Supplementary Note 15)

According to a further aspect of the present disclosure, there is provided a method of manufacturing a semiconductor device, including:

mounting substrates on a substrate mounting table rotatably installed within a processing chamber for processing the substrates, the substrates being mounted along a rotation direction of the substrate mounting table;

rotating the substrate mounting table;

exhausting an interior of the processing chamber;

supplying a first-element-containing gas containing a first element to a first processing region defined within the processing chamber along the rotation direction of the substrate mounting table;

supplying a second-element-containing gas containing a second element to a second processing region defined within the processing chamber along the rotation direction of the substrate mounting table;

performing a first processing for activating the second-element-containing gas to have a first activity in the second processing region by a plasma generating unit installed at least in part within the second processing region; and performing a second processing for activating the second-element-containing gas to have a second activity lower than the first activity in the second processing region.

(Supplementary Note 16)

According to a further aspect of the present disclosure, there is provided a program that causes a computer to perform:

mounting substrates on a substrate mounting table rotatably installed within a processing chamber for processing the substrates, the substrates being mounted along a rotation direction of the substrate mounting table;

rotating the substrate mounting table;

exhausting an interior of the processing chamber;

supplying a first-element-containing gas to a first processing region defined within the processing chamber along the rotation direction of the substrate mounting table;

supplying a second-element-containing gas to a second processing region defined within the processing chamber along the rotation direction of the substrate mounting table;

performing a first sequence for activating the second-element-containing gas to have a first activity in the second processing region by a plasma generating unit installed at least in a portion within the second processing region; and performing a second sequence for activating the second-element-containing gas to have a second activity lower than the first activity in the second processing region.

(Supplementary Note 17)

According to a further aspect of the present disclosure, there is provided a non-transitory computer-readable recording medium storing a program that causes a computer to perform:

mounting substrates on a substrate mounting table rotatably installed within a processing chamber for processing the substrates, the substrates being mounted along a rotation direction of the substrate mounting table;

rotating the substrate mounting table;

exhausting an interior of the processing chamber;

supplying a first-element-containing gas to a first processing region defined within the processing chamber along the rotation direction of the substrate mounting table;

supplying a second-element-containing gas to a second processing region defined within the processing chamber along the rotation direction of the substrate mounting table;

performing a first sequence for activating the second-element-containing gas to have a first activity in the second processing region by a plasma generating unit installed at least in a portion within the second processing region; and performing a second sequence for activating the second-element-containing gas to have a second activity lower than the first activity in the second processing region.

EXPLANATION OF REFERENCE NUMERALS

10: substrate processing apparatus, 200: wafer (substrate), 201a: first processing region, 201b: second processing region, 203: reaction container, 206: plasma generating unit, 217: susceptor, 267: rotating mechanism, 300: controller (control part)

What is claimed is:

1. A method of manufacturing a semiconductor device, comprising:
   mounting a plurality of substrates on a substrate mounting table rotatably installed within a processing chamber to process the substrates, the substrates being mounted along a rotation direction of the substrate mounting table;
   starting to supply a first-element-containing gas to a first processing region defined within the processing chamber along the rotation direction of the substrate mounting table, while rotating the substrate mounting table and exhausting an interior of the processing chamber;
   starting to supply a second-element-containing gas to a second processing region defined within the processing chamber;
   performing a first processing to begin generating, by a plasma generating unit installed in the second processing region, plasma of the second-element-containing gas in the second processing region to have a first activity; and
   performing a second processing to form a thin film containing a first element and a second element on each of the substrates by rotating the substrate mounting table to cause the substrates to sequentially pass through the first processing region and the second processing region a predetermined number of times in turn so that a first-element-containing layer is formed in the first processing region, and the first-element-containing layer is modified in the second processing region by generating plasma having a second activity that is higher than the first activity.

2. The method of claim 1, wherein in the first processing, a pressure in the second processing region is set to be lower than a pressure in the second processing region in the second processing.

3. The method of claim 1, wherein in the first processing, a pressure in the second processing region is set at a pressure at which the second-element-containing gas is diffused within the second processing region.

4. The method of claim 2, wherein in the first processing, a pressure in the second processing region is set at a pressure at which the second-element-containing gas is diffused within the second processing region.

5. The method of claim 1, wherein in the first processing, a pressure in the second processing region is gradually increased after starting to generate the plasma.

6. The method of claim 1, further comprising,
   performing a third processing, wherein in the third processing, a pressure in the second processing region is set to be lower than a pressure in the second processing region in the second processing, during a time period from completion of the second processing to an extinguishment of the plasma of the second-element-containing gas.

* * * * *